United States Patent
Henneau

(10) Patent No.: US 11,014,784 B2
(45) Date of Patent: May 25, 2021

(54) METHOD AND DEVICE FOR DETERMINING A DETERIORATION STATE IN A SUSPENSION MEMBER FOR AN ELEVATOR

(71) Applicant: Inventio AG, Hergiswil (CH)

(72) Inventor: Philippe Henneau, Zurich (CH)

(73) Assignee: INVENTIO AG, Hergiswil NW (CH)

( * ) Notice: Subject to any disclaimer, the term of this patent is extended or adjusted under 35 U.S.C. 154(b) by 636 days.

(21) Appl. No.: 15/748,277

(22) PCT Filed: Jul. 28, 2016

(86) PCT No.: PCT/EP2016/067970
§ 371 (c)(1),
(2) Date: Jan. 29, 2018

(87) PCT Pub. No.: WO2017/021265
PCT Pub. Date: Feb. 9, 2017

(65) Prior Publication Data
US 2018/0215584 A1 Aug. 2, 2018

Related U.S. Application Data

(63) Continuation of application No. 14/814,558, filed on Jul. 31, 2015, now Pat. No. 9,932,203.

(Continued)

(30) Foreign Application Priority Data

Feb. 11, 2016 (EP) ..................................... 16155357
Feb. 11, 2016 (EP) ..................................... 16155358

(Continued)

(51) Int. Cl.
*B66B 7/12* (2006.01)
*D07B 1/14* (2006.01)

(Continued)

(52) U.S. Cl.
CPC ............ *B66B 7/1223* (2013.01); *B66B 7/062* (2013.01); *B66B 7/085* (2013.01); *B66B 7/1215* (2013.01);

(Continued)

(58) Field of Classification Search
CPC .. D07B 2501/2007; H02K 35/00; B66B 7/06; B66B 7/062; B66B 7/12; B66B 7/1223;

(Continued)

(56) References Cited

U.S. PATENT DOCUMENTS 4,929,897 A 5/1990 Van Der Walt
5,731,528 A 3/1998 Yamazaki et al.
(Continued)

FOREIGN PATENT DOCUMENTS

CN 1290647 A 4/2001
CN 101259930 A 9/2008
(Continued)

OTHER PUBLICATIONS

Huaming Lei et al. "Health Monitoring for Coated Steel Belts in an Elevator System" Hindawi Publishing Corporation Journal of Sensors, vol. 2012, Article ID 750261, 5 pages.

*Primary Examiner* — Marlon T Fletcher
(74) *Attorney, Agent, or Firm* — William J. Clemens; Shumaker, Loop & Kendrick, LLP

(57) ABSTRACT

A method for determining a deterioration state in a suspension member arrangement having a suspension member including a plurality of electrically conductive cords includes the steps of: counting a number of bending cycles applied to the suspension member; measuring an electrical characteristic of the suspension member upon applying an electrical voltage to at least one of the cords; performing at least one of (a) determining a critical deterioration state upon monitoring both the bending cycles number and the (Continued)

electrical characteristic, and (b) determining an unexpected deterioration state based on deriving a current actual deterioration state of the suspension member based on the electrical characteristic and assuming a currently expected deterioration state based on the bending cycles number and comparing the current actual deterioration state with the currently expected deterioration state; initiating a defined procedure upon determining at least one of the critical deterioration state and the unexpected deterioration state.

15 Claims, 5 Drawing Sheets

Related U.S. Application Data

(60) Provisional application No. 62/199,375, filed on Jul. 31, 2015.

(30) Foreign Application Priority Data

| | | |
|---|---|---|
| Apr. 14, 2016 | (EP) | 16165431 |
| Apr. 28, 2016 | (EP) | 16167403 |

(51) Int. Cl.
- *B66B 7/08* (2006.01)
- *B66B 19/00* (2006.01)
- *G01R 31/08* (2020.01)
- *B66B 7/06* (2006.01)
- *G01M 5/00* (2006.01)
- *G01N 27/20* (2006.01)

(52) U.S. Cl.
CPC ............ *B66B 19/007* (2013.01); *D07B 1/145* (2013.01); *G01M 5/0033* (2013.01); *G01M 5/0091* (2013.01); *G01N 27/20* (2013.01); *G01R 31/081* (2013.01); *D07B 2501/2007* (2013.01); *D10B 2401/16* (2013.01); *G01R 31/08* (2013.01)

(58) Field of Classification Search
CPC ....... B66B 7/1215; B66B 7/064; B66B 7/068; B66B 7/085; B66B 11/007; H01B 11/22; H02N 11/006
See application file for complete search history.

(56) References Cited

U.S. PATENT DOCUMENTS

| | | | |
|---|---|---|---|
| 6,040,779 A | 3/2000 | Pfaff et al. | |
| 6,422,088 B1 | 7/2002 | Oba et al. | |
| 6,653,943 B2 | 11/2003 | Lamb et al. | |
| 6,828,771 B1 | 12/2004 | Ghassemi | |
| 7,123,030 B2 | 10/2006 | Robar et al. | |
| 8,011,479 B2 | 9/2011 | Stucky et al. | |
| 8,424,653 B2 | 4/2013 | Stucky et al. | |
| 8,686,747 B2 * | 4/2014 | Berner | B66B 7/1223 324/691 |
| 8,813,918 B2 | 8/2014 | Kocher et al. | |
| 9,932,203 B2 | 4/2018 | Robibero | |
| 2002/0194935 A1 | 12/2002 | Clarke et al. | |
| 2003/0121729 A1 | 7/2003 | Heinz et al. | |
| 2008/0223668 A1 | 9/2008 | Stucky et al. | |
| 2008/0282512 A1 | 11/2008 | Ach | |
| 2011/0253487 A1 | 10/2011 | Kocher et al. | |
| 2011/0284331 A1 | 11/2011 | Stucky et al. | |
| 2012/0211310 A1 * | 8/2012 | Peric | B66B 7/062 187/254 |
| 2013/0207668 A1 | 8/2013 | Fargo et al. | |
| 2014/0182974 A1 * | 7/2014 | Puranen | B66B 5/0018 187/247 |
| 2014/0305744 A1 * | 10/2014 | Kere | B66B 7/06 187/254 |
| 2015/0015280 A1 * | 1/2015 | Guilani | G01N 27/20 324/699 |
| 2015/0063415 A1 * | 3/2015 | Garfinkel | B66B 7/1223 374/142 |
| 2015/0129367 A1 * | 5/2015 | Tyni | B66B 3/00 187/393 |
| 2015/0166305 A1 * | 6/2015 | Kalliomaki | B66B 5/125 187/254 |
| 2015/0329319 A1 * | 11/2015 | Lehtinen | B66B 7/1215 187/254 |
| 2015/0344267 A1 * | 12/2015 | Valjus | B66B 5/02 187/254 |
| 2015/0362450 A1 * | 12/2015 | Lehtinen | G01N 27/20 187/391 |
| 2015/0375963 A1 * | 12/2015 | Sun | B66B 5/0031 187/254 |
| 2016/0002006 A1 * | 1/2016 | Sun | B66B 9/00 187/254 |
| 2016/0046463 A1 * | 2/2016 | Saarelainen | B66B 5/02 187/254 |
| 2016/0060077 A1 * | 3/2016 | Haapaniemi | B66B 11/08 187/255 |
| 2017/0043978 A1 * | 2/2017 | Valjus | B66B 5/044 |
| 2018/0215584 A1 * | 8/2018 | Henneau | G01N 27/20 |
| 2018/0215585 A1 * | 8/2018 | Robibero | D07B 1/145 |

FOREIGN PATENT DOCUMENTS

| | | |
|---|---|---|
| CN | 101456509 A | 6/2009 |
| CN | 103068711 A | 4/2013 |
| CN | 103910267 A | 7/2014 |
| DE | 197085818 A1 | 10/1998 |
| EP | 1730066 B1 | 10/2010 |
| EP | 1732837 B1 | 4/2011 |
| EP | 3124425 A1 | 2/2017 |
| EP | 3124986 A1 | 2/2017 |
| JP | S54107038 A | 8/1979 |
| JP | H0891734 A | 4/1996 |
| WO | 2005095250 A1 | 10/2005 |
| WO | 2010007112 A1 | 1/2010 |
| WO | 2011098847 A1 | 8/2011 |
| WO | 2013119203 A1 | 8/2013 |
| WO | 2013135285 A1 | 9/2013 |
| WO | 2014083043 A1 | 6/2014 |
| WO | 2014130028 A1 | 8/2014 |
| WO | 2014130029 A1 | 8/2014 |

* cited by examiner

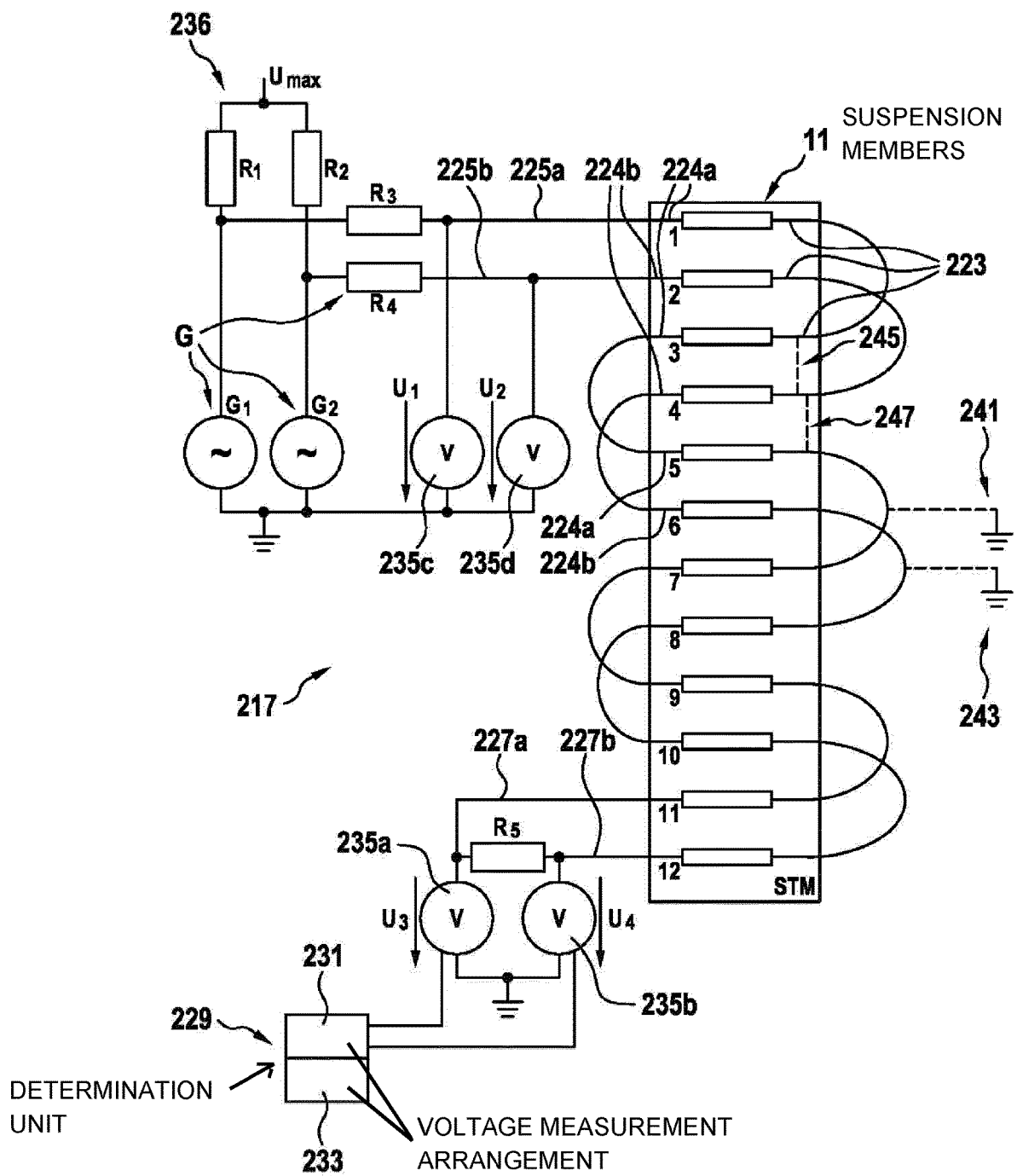

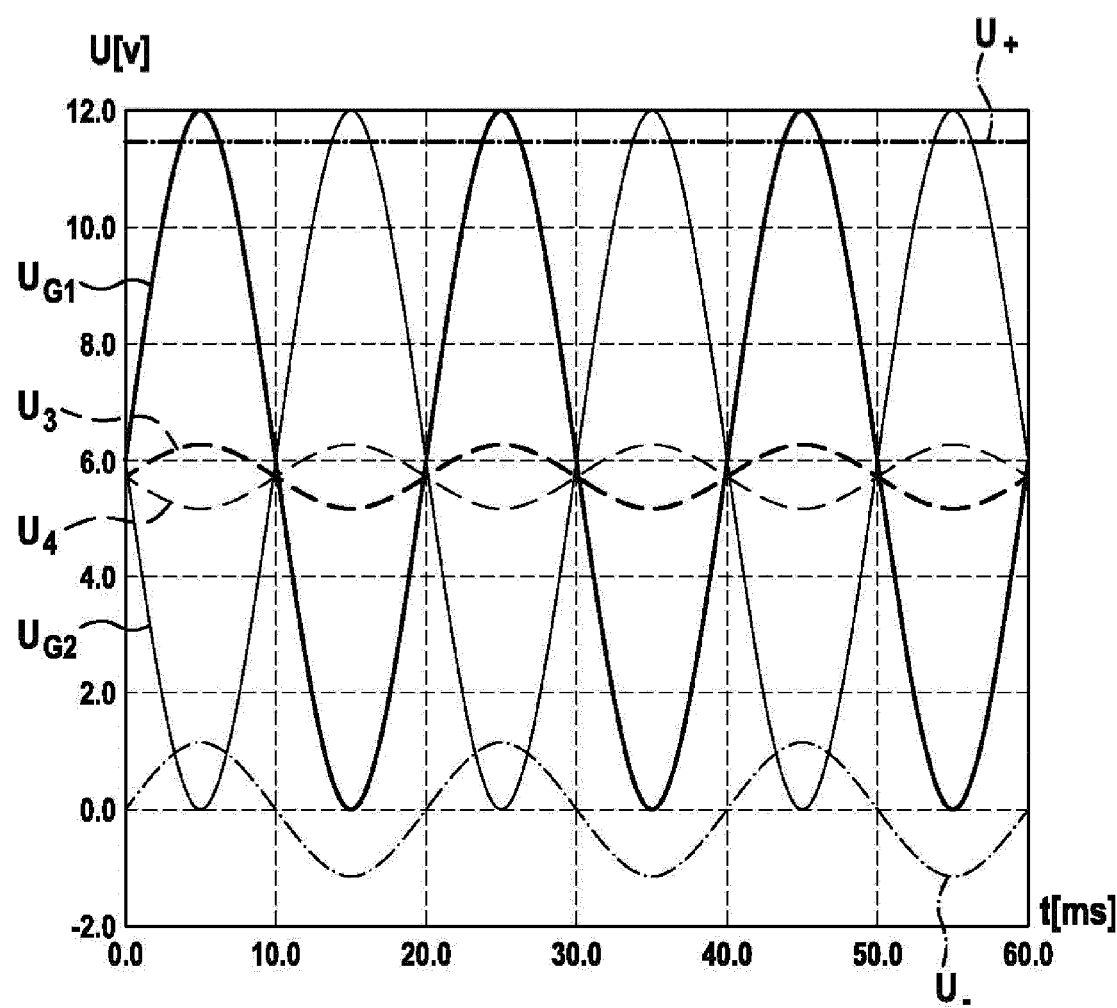

METHOD AND DEVICE FOR DETERMINING A DETERIORATION STATE IN A SUSPENSION MEMBER FOR AN ELEVATOR

FIELD

The present invention relates to a method and to a device for determining a deterioration state, particularly a deterioration state of a load bearing capacity, in a suspension member arrangement for an elevator.

BACKGROUND

Elevators typically comprise a car and, optionally, a counterweight which may be displaced for example within an elevator shaft to different levels in order to transport persons or items for example to various floors within a building. In a common type of elevator, the car and/or the counterweight are supported by a suspension member arrangement comprising one or more suspension members. Suspension members are sometimes also referred to as suspension traction members or suspension traction media (STM). A suspension member may be a member which may carry heavy loads in a tension direction and which may be bent in a direction transverse to the tension direction. For example, a suspension member may be a rope or a belt. Typically, suspension members comprise a plurality of cords. The cords may be made for example with a metal such as steel.

During operation of the elevator, suspension members have to carry high loads and are typically repeatedly bent when running along for example a traction sheave, a pulley, a deflection sheave or other types of sheaves. Accordingly, substantial stress is applied to the suspension member arrangement during operation.

However, as elevators may typically be used by people for transportation along very significant heights, very high security requirements have to be fulfilled. For example, it has to be safeguarded that the suspension member arrangement can always guarantee safe support of the car and/or the counterweight. For such purposes, safety regulations rule that any substantial deterioration of an initial load bearing capacity of a suspension member arrangement can be detected such that for example counter-measures such as replacing a faulty suspension member from the suspension member arrangement may be initiated.

Generally, a load bearing capacity of a suspension member may be specified when designing the suspension member and may then be physically tested upon completion of the fabrication of the suspension member. Physical tests may comprise for example tensile loading of the suspension member and measuring the suspension member's reaction to an application of high tensile forces.

However, during actual operation of the elevator, it may be difficult or even impossible to perform such physical tests. With conventional steel ropes serving as suspension members, visual checking of a rope condition has been possible. However, in modern suspension members, load bearing cords are typically enclosed in a coating or matrix and are therefore not visible from outside. Therefore, alternative approaches for determining a load bearing capacity in a suspension member arrangement or determining parameters related thereto have been developed.

For example, elevator load bearing member wear and failure detection has been described in EP 1 730 066 B1. A method and apparatus for detecting elevator rope degradation using electrical resistance is described in U.S. Pat. No. 7,123,030 B2. Electrical signal application strategies for monitoring a condition of an elevator load bearing member are described in US 2011/0284331 A1 and U.S. Pat. No. 8,424,653 B2. Electrical signal application strategies for monitoring a condition of an elevator load bearing member are described in US 2008/0223668 A1 and U.S. Pat. No. 8,011,479 B2. A simplified resistance based belt type suspension inspection is disclosed in US 2013/0207668 A1. An elevator system belt type suspension having connecting devices attached thereto is described in WO 2011/098847 A1. A method for detection of wear or failure in a load bearing member of an elevator is described in WO 2013/135285 A1. Electrical signal application strategies for monitoring a condition of an elevator load bearing member are described in EP 1 732 837 B1. "Health Monitoring for Coated Steel Belts in an Elevator System" have been described in a research article of Huaming Lei et al. in the *Journal of Sensors*, Volume 2012, Article ID 750261, 5 pages, doi: 10.1155/2012/750261. WO 2013/119,203 A1 discloses wear detection for a coated belt or rope, but does not consider bending cycles as such or a measurement thereof. The disclosure of all these documents shall be incorporated herein by reference.

Further alternative approaches for detecting a deterioration state in a suspension member arrangement have been proposed by the applicant of the present application in earlier patent applications U.S. 62/199,375, U.S. Ser. No. 14/814,558, EP 16 155 357 A1 and EP 16 155 358 A1, all of which shall also be incorporated herein by reference. In these specific approaches, while electrical characteristics of suspension members and the cords comprised therein are determined, it is not necessary to specifically measure any electrical resistances in the cords or any magnitude of electrical currents through the cords but, instead, it may be enabled to obtain information about the electrical characteristics of the suspension member by correlating for example various electrical measurements and interpreting results from such relative correlation. In other words, in these approaches it may not be necessary to have any detailed knowledge about absolute resistance values or current values but it may be sufficient to correlate various electrical measurements in order to obtain valuable information about electrical characteristics in the suspension member which allow determining information about the deterioration state of such suspension member.

In another alternative approach, a deterioration state of a suspension member is not detected by measuring any physical parameters of the suspension member itself but, instead, it is assumed that the suspension member deteriorates over time mainly due to wear occurring as a result of bending the suspension member. Such approach is for example described in WO 2010/007112 A1, the disclosure of which shall be incorporated herein by reference.

There may be a need for an alternative method and device for determining a deterioration state in a suspension member arrangement for an elevator. Particularly, there may be a need for such method and device which enable fulfilling high safety requirements, simple implementation and/or low cost.

SUMMARY

Such needs may be met with the subject-matter of the embodiments defined in the following specification.

A first aspect of the present invention relates to a method for determining a deterioration state in a suspension member arrangement for an elevator. The suspension member arrangement comprises at least one suspension member comprising a plurality of electrically conductive cords. The method comprises at least the following steps:

counting a number of bending cycles applied to the suspension member;

determining an electrical characteristic of the suspension member;

performing (a) determining a critical deterioration state upon monitoring both: the counted number of bending cycles applied to the suspension member and the determined electrical characteristic of the suspension member; and/or (b) determining an unexpected deterioration state based on deriving a current actual deterioration state of the suspension member based on the determined electrical characteristic and assuming a currently expected deterioration state based on the counted number of bending cycles and comparing the current actual deterioration state with the currently expected deterioration state; and initiating a defined procedure upon the determining of at least one of the critical deterioration state and the unexpected deterioration state.

Without restricting the scope of the invention in any way, ideas underlying embodiments of the invention may be understood as being based, inter alia, on the following recognitions and observations:

On the one hand, in conventional approaches for detecting a deterioration state of a load bearing capacity in a suspension member arrangement such as some of those approaches indicated in the above introductory portion, electrical characteristics of cords included in a suspension member have been taken as indicators for changes in the deterioration state of the suspension member. In some of the prior art approaches, electrical resistances or other electrical characteristics within the cords have been measured and it has been assumed that an increase of such electrical resistances correlates to a deterioration of the load bearing capacity of the suspension member.

However, it has been found that it may be very difficult or even impossible to define sufficiently precise quantitative indicators for a critical or unexpected deterioration state of a suspension member based only on measuring electrical characteristics in the suspension member. For example, wear, fatigue phenomena and/or corrosion may slowly deteriorate the suspension member and particularly its load bearing capacity. It has been found that particularly deteriorations of the suspension member due to such slowly acting effects may be very difficult to be detected. While it is assumed that such effects may alter for example electrical resistances through the cords of the suspension member, it is hardly possible to determine any unambiguous indicators such as for example maximum electrical resistance values which, when being exceeded, would necessarily indicate excessive deterioration of the suspension member.

On the other hand, alternative approaches for determining the deterioration state of the suspension member only based on counting specific deteriorating events such as counting bendings of the suspension member may also be assumed as being insufficient for unambiguously indicating excessive deterioration of the suspension member. This is particularly true as such approaches mainly rely on wear and deterioration experiments performed under specific conditions.

For example, using a new suspension member directly after its fabrication, experiments have been performed in which the suspension member was put under substantial mechanical stress by repeated bending thereof and it was then tested after which number of bendings the suspension member loses for example 20% or 40% of its initial load bearing capacity, such loss being assumed as an excessive deterioration. Based on such experiments, it is then assumed that the suspension member may be bent at least a specific number of times before being excessively deteriorated such that it needs to be for example replaced.

However, as these experiments are generally performed under specific conditions in which it is assumed, on the one hand, that the suspension member in its initial state is not deteriorated and in which is furthermore assumed, on the other hand, that deteriorations within the suspension member mainly occur due to repeated bending thereof, such approaches for determining deteriorations may generally ignore other influences which also may deteriorate the quality of the suspension member.

For example, incorrect handling of the suspension member during e.g. transport from a fabrication site to an installation site and/or during installation of the suspension member at the installation site may harm the integrity of the suspension member. For example, a belt serving as a suspension member may be damaged during transportation or installation such that its polymer jacket enclosing its cords is damaged. Due to such damage, the cords may for example be exposed, i.e. be no more protected by the jacket, such that e.g. local corrosion of the exposed cords may significantly deteriorate the quality of the belt.

In other words, it has been found that both conventional approaches, i.e. the measuring of electrical characteristics as well as the counting of bendings of the suspension member, when taken as a single measure may not reliably indicate excessive deterioration of the suspension member.

It is therefore proposed herein to combine these conventional approaches in order to provide for a more reliable method for determining a deterioration state in a suspension member arrangement. Therein, the number of bending cycles applied to the suspension member is counted as one measure and, additionally as another measure, electrical characteristics of the suspension member are determined.

A critical deterioration state may then be determined for example when either the counted number of bending cycles exceeds a specific allowable maximum number of bending cycles or the measured electrical characteristics deviate from reference characteristics by more than an allowable maximum deviation.

Alternatively or additionally, an unexpected deterioration state may be determined by, on the one hand, deriving a current actual deterioration state of the suspension member based on the determined electrical characteristic(s) and, on the other hand, assuming a currently expected deterioration state based on the counted number of bending cycles and, finally, comparing the current actual deterioration state with the currently expected deterioration state. In other words it is verified whether or not the currently measured electrical characteristics of the suspension member indicate an actual deterioration state with conforms to an expected deterioration state as it may be assumed due to the counted number of bendings (i.e. the "operational age") of the suspension member.

Upon the determining the critical deterioration state and/or the unexpected deterioration state, an adequate defined procedure may be initiated such as e.g. stopping operation of the elevator, adequately modifying its operation, and/or informing a third party regarding the critical deterioration state and/or the unexpected deterioration state.

In other words, two generally independent indicators are monitored for finally determining whether the suspension member is excessively and/or unexpectedly deteriorated or not in order to then enable initiating suitable measures such as stopping an operation of the elevator and/or replacing the suspension member and/or providing relevant information to the operator or to servicing/maintenance staff of the elevator.

In such combined approach, it may be assumed, on the one hand, that a deterioration of the suspension member is mainly affected by repeated bending thereof. Thus, by counting the bending cycles and comparing e.g. with an allowable maximum number of bending cycles which has previously be determined based on for example intensive experimentation, a well-defined criterion for distinguishing between acceptable deteriorations and excessive deteriorations of the suspension member may be provided.

However, in the combined approach proposed herein, it is also taken into account that such assumption is generally only true as long as the suspension member is correctly handled and operated and is not, for example, damaged by other effects than the repeated bending thereof. Therefore, in order to also enable accounting for such additional deteriorating effects, electrical characteristics of the suspension member are also determined or measured and are additionally taken into account as an additional indicator for an excessive deterioration of the suspension member. As described in further detail below, such electrical characteristics may provide for reliable indicators indicating various types of damages to the suspension member all of which may immediately reduce for example a load bearing capacity of the suspension member or at least reduce a life cycle of the suspension member.

In other words, in the combined approach proposed herein, no or only an acceptable deterioration of the suspension member is generally assumed as long as the number of bending cycles applied to the suspension member does not exceed the allowable maximum number. However, this is only true as long as the electrical characteristics of the suspension member measured generally simultaneously with counting the bending cycles indicate that no specific damages or specific deteriorations occurred at the suspension member. If, however, such specific damages or a specific deteriorations are detected based on the electrical measurements, they may be taken as indicating excessive or unexpected deteriorations of the suspension member or, alternatively, they may be taken as at least influencing the deterioration state of the suspension member such that, for example, the allowable maximum number of bending cycles may be adapted or corrected to a lower value.

Accordingly, using the combined approach proposed herein, a reliability in determining an excessive deterioration state in a suspension member may be significantly improved in comparison to applying each single approach alone. Furthermore, synergy effects may occur upon combining the two prior art approaches thereby possibly further increasing an operation safety of the elevator and/or allowing economical benefits.

According to an embodiment of the present invention, the allowable maximum deviation about which the currently determined electrical characteristics are allowed to deviate from reference characteristics is determined taking into account the counted number of bending cycles applied to the suspension member.

In other words, the allowable maximum deviation about which the currently measured electrical characteristics may deviate from reference characteristics before being interpreted as indicating a critical deterioration state may not necessarily be a fixed number or parameter. Instead, such allowable maximum deviation may be determined taking into account how often the suspension member has already been bent, i.e. taking into account characteristics of the suspension member relating to its operational "age".

For example, measuring specific electrical characteristics for a relatively novel suspension member which has not yet significantly deteriorated due to repeated bending thereof may be interpreted as not yet indicating any critical deterioration state whereas measuring the same specific electrical characteristics for an old suspension member which has already been bent many times and which is therefore already significantly deteriorated and close to its end of life cycle may be interpreted as indicating an actually critical deterioration state for this old suspension member.

Accordingly, the two criteria for determining the critical deterioration state of the suspension member, i.e. the counted number of bending cycles and the currently measured electrical characteristics, do not necessarily have to be independently interpreted from each other but, to the contrary, may inter-correlate. Specifically, the counted number of bendings of the suspension member may be taken into account when deciding whether or not a specific measured electrical characteristics shall be interpreted as indicating a critical deterioration state or not.

This may advantageously result in an extended usability of the suspension member as, for example, the decision whether or not a critical deterioration state is present due to which, for example, the suspension member has to be replaced may be made on the basis of more sophisticated indications. For example, slight deviations in the measured electrical characteristics of the suspension member at the beginning of its life-cycle will not necessarily result in obligating any replacement of the suspension member whereas at a later stage in the life-cycle the same electrical characteristics may be interpreted as indicating critical deteriorations necessitating immediate replacement of the suspension member.

Alternatively, according to an embodiment of the present invention, the allowable maximum deviation is fixedly predetermined.

In other words, the allowable maximum deviation about which currently measured electrical characteristics may deviate from reference characteristics may be fixedly set. For example, such allowable maximum deviation may be derived from preceding experimentations. For example, tests or experiments may show that specific damages or critical deteriorations of the suspension member typically come along with a change in electrical characteristics such that when currently measured electrical characteristics of the suspension member alter by such specific deviation this may interpreted as indicating that critical deterioration state.

Assuming fixedly predetermined allowable maximum deviations may be implemented in a simple manner such as for example storing corresponding deviation values in a memory comprised in a device adapted for performing the monitoring method proposed herein.

According to an embodiment of the present invention, the allowable maximum number of bending cycles is determined taking into account the currently determined electrical characteristics of the suspension member.

In other words, similarly to the embodiment explained further above, the two determination criteria may be interpreted as influencing each other. In the present case, the allowable maximum number about which the suspension member may be bent before assuming its end of life due to excessive deterioration thereof may not be a fix number but, instead, may itself depend on currently measured electrical characteristics of the suspension member.

For example, when the measured electrical characteristics indicate that the suspension member is in a very good state although it is already rather old and has been bent many times, this information may be used to increase the allowable maximum number of bendings such that the suspension member is allowed to have a longer operational life than a suspension member for which the measured electrical characteristics already indicate some significant, but not yet critical, deteriorations.

Accordingly, the life-cycle of the suspension member may be adapted better to its actual deterioration conditions and suspension members may therefore potentially be used for a longer period of time without increasing a risk for failures.

Alternatively, according to an embodiment of the present invention, the allowable maximum number of bendings is fixedly predetermined.

Such fixedly predetermined maximum number may be derived for example from preceding experiments or tests. The fixed number may be easily stored for example in a device's memory for subsequent repeated comparing with the currently counted number of bending cycles.

According to an embodiment of the present invention, the reference characteristics to which the currently determined electrical characteristics may be compared are determined based upon measuring electrical characteristics of the suspension member in a non-deteriorated condition.

In other words, when determining whether the measured electrical characteristics indicate a critical deterioration state of the suspension member, currently measured electrical characteristics shall be compared to reference electrical characteristics which have been measured in a state in which the suspension member was not deteriorated, i.e. for example directly after fabricating and testing the suspension member. Accordingly, by comparing currently measured electrical characteristics with original electrical characteristics of the suspension member it may be determined whether or not these electrical characteristics have significantly altered and deviate from the original electrical characteristics by more than an allowable deviation. By specifically comparing the currently measured electrical characteristics with non-deteriorated characteristics, it may be determined for example whether the suspension member has been significantly damaged e.g. during transportation, storage and/or installation thereof.

As used herein, the term bending cycles may be understood for example as referring to a process of bending at least a portion of the suspension member in a direction transverse to its longitudinal direction. For example, the suspension member is bent when running along a traction sheave or a pulley. One bending cycle may be interpreted as resulting from bending at least a portion the suspension member once into a bending direction and then bending it back. Each back and forth bending generally significantly stresses the suspension member and induces wear effects.

According to an embodiment of the present invention, the suspension member is subdivided into several sections and a number of section bending cycles applied to each section of the suspension member is counted for each of the sections. The number of bending cycles applied to the suspension member is then set to correspond to the maximum of all numbers of section bending cycles counted for each of the sections of the suspension member.

In other words, bending cycles of the suspension member are preferably not simply counted independent of a location where the suspension member is bent. To the contrary, the suspension member is assumed to be subdivided into a multiplicity of sections and it is then determined at which of the sections the suspension member has been bent. The bending cycles are counted for each of the sections separately. For example, some sections of the suspension member are bent more frequently during typical operation of the elevator than other sections. This may be due to e.g. the fact that an elevator car is moved more frequently to specific floors such as a ground floor than to other locations.

The number of bending cycles taken as indicating whether or not a critical deterioration state has been reached is then not necessarily equal to the number of bendings applied to the suspension member in its entirety but shall correspond to the number of bendings applied to the section of the suspension member which has been bent most frequently.

Accordingly, as the number of bendings applied to each one of the various sections of the suspension member is typically significantly lower than the overall number of bendings applied to the entire suspension member, the life-cycle of the suspension member may be significantly extended while still providing for very high operational safety as the critical deterioration state of the suspension member may be determined as resulting from its "weakest section". I.e. the critical deterioration state of the suspension member is determined based on the counted number of bending cycles applied to the section which has been bent most frequently.

A similar approach has been described by the applicant of the present application in previous patent applications and/or patents WO 2010/007112 A1 and EP 2 303 749 B1 which shall be incorporated herein in their entirety by reference. It shall be specifically noted that protection is or may be sought also for such features described in these previous applications and/or patents and that such features may contribute to achieving the technical aim of embodiments of the present invention and may thus be comprised in the solution of the technical problem underlying the invention which is the subject of the present application. Particularly, such features may implicitly clearly belong to the description of the invention contained in the present application as filed, and thus to the content of the application as filed. Such features are precisely defined and identifiable within the total technical information within the reference documents.

In a significantly simplified approach, the number of bending cycles applied to the suspension member may be set equal to a number of trips performed by the elevator in one motion direction before reversing the motion direction. It is then assumed that during each trip the suspension member is bent at least in some of its sections due to e.g. being guided along a traction sheave or pulley. The same sections may only be bent again if the motion direction of the elevator is reversed at a later point in time and the sections are guided again along the traction sheave of pulley. In other words, in such simplified approach, the number of bending cycles may be taken as being related to a number of times of reversal of the motion direction of the elevator during its operation.

Such approach may be particularly easy to implement as many elevators comprise a trip counter such that the number of bendings of the suspension member may easily be assumed to correspond to the number of trips counted by the trip counter. However, such approach does not take into account that generally during each trip only some, but not all, of the sections of the suspension member will be bent. Accordingly, such simplified approach will generally result in assuming a critical deterioration state earlier than with the more sophisticated approach describe before.

According to an embodiment of the present invention, the measuring of the electrical characteristics of the suspension member comprises at least one of:

electrical measurements indicating that at least one cord in the suspension member is broken;

electrical measurements indicating that an electrical connection between a voltage supply for applying the electrical voltage to the at least one of the cords and the at least one of the cords is interrupted;

electrical measurements indicating that at least one cord in the suspension member is electrically connected to ground;

electrical measurements indicating that at least two cords in the suspension member are shorted;

electrical measurements indicating that an electrical conductivity through at least one of the cords of the suspension member changed over time.

In other words, the step of measuring electrical characteristics of the suspension member may comprise one or more of different types of electrical measurements, each type specifically relating to a specific type of deterioration or damage possibly occurring within a suspension member.

For example, electrical measurements may indicate that at least one of the cords comprised in the suspension member is broken. In such case, an electrical connection through the broken cord is generally interrupted which may be easily detected e.g. by applying an electrical test voltage to the cord at one end thereof and detecting a resulting voltage for example at the opposite end of the suspension member. One or more broken cords in a suspension member typically represent a severe deterioration of the load bearing capacity of the suspension member.

As a further example, electrical measurements may be used for testing whether or not the voltage supply for applying the electrical voltage to the at least one cord is still correctly connected to the respective cord or whether there is an electrical interruption. While such interruption may not necessarily indicate a critical deterioration of the load bearing capacity of the suspension member, it may still represent a critical deterioration state for the elevator as due to such interruption no meaningful measurements of electrical characteristics may be performed at the suspension member. Therefore, detecting such non-connected voltage supply or electrical interruption may be necessary for securing the safety of the elevator.

As a third example, electrical measurements may indicate that at least one of the cords comprised in the suspension member is electrically connected to ground. Such ground connection may typically occur as a result of damages to the jacket enclosing the cords. Due to such damages, one or more cords may be locally exposed and may therefore come into contact for example with electrically grounded sheaves or pulleys or other components within an elevator arrangement. Accordingly, upon detecting any electrical grounding of one or more cords, it may be assumed that for example the jacket of the suspension member is damaged, such damage possibly immediately or over a longer term resulting in a deterioration of the suspension member.

As a fourth example, electrical measurements may indicate that at least two cords in the suspension member are electrically connected to each other, i.e. are shorted. Such electrical shorting may occur typically upon the isolating portions of the jacket between neighboring cords being damaged. Accordingly, detecting such electrical shortings may be taken as indicating damages of the jacket which may potentially result in a deterioration of the suspension member.

As a final example, electrical measurements may indicate that an electrical conductivity through at least one of the cords comprised in the suspension member changed over time, i.e. does no more correspond to the electrical conductivity through the cords in their initial state. Such changes in electrical connectivity may result from changes in other physical characteristics of the cords such as general or local corrosion of the cords. Accordingly, changes in the electrical conductivity may indirectly indicate changes in these other physical characteristics which may then correlate to a critical deterioration state, particularly with a reduced load bearing capacity, of the suspension member.

According to an embodiment of the present invention, the determining of electrical characteristics comprises at least one of determining an electrical resistivity through the suspension member, determining an electrical conductivity through the suspension member, determining an inductivity through the suspension member, determining electrical characteristics using magnetic measurements applied to the suspension member, and determining electrical characteristics using phase measurements applied to the suspension member.

For example, prior art approaches such as those mentioned in the introductory portion teach that a deterioration state of a suspension member may be at least qualitatively or even quantitatively determined based upon measuring electrical resistances through cords of the suspension member. Accordingly, by for example measuring such electrical resistances, it may be determined whether a critical deterioration state occurred at the suspension member e.g. due to continuous wear such that e.g. the suspension member should be replaced even before an allowable number of bending cycles has been reached. Alternatively, by for example measuring such electrical resistances, it may be verified whether an expected deterioration state of the suspension member which is assumed only based on the operation age of the suspension member, i.e. the number of bending cycles applied thereto, corresponds to the actual deterioration state as derived from the electrical characteristics, i.e. in this case the measured electrical resistance.

According to an embodiment of the present invention, upon measuring the electrical characteristics, an electric indicator current $I_n$ correlating to a net sum of all phases of a multi-phase alternating current is measured, wherein at least one of the phases of the multi-phase alternating current is applied to one of the cords of the suspension member.

According to a more specific embodiment of the present invention, the measuring of electrical characteristics of the suspension member comprises:

providing a multi-phase alternating current circuitry including multiple electrically conductive legs;

applying at least one phase of a multi-phase alternating current to at least one of the cords of the suspension member by being electrically connected to one of the legs of the multi-phase alternating current circuitry;

applying at least one other phase of the multi-phase alternating current to at least one of another at least one cord of the suspension member and at least one separate resistor being electrically connected to at least one other leg of the multi-phase alternating current circuitry, wherein a peak current in each phase is shifted by a phase angle with respect to a peak current in another phase;

measuring an electric indicator current $I_n$ being at least one of:

a net sum of all phases of the multi-phase alternating current and an electric bypass current through a neutral wire being connected in parallel to the multi-phase alternating current circuitry;

determining the measured electrical characteristics of the suspension member based on the measured indicator electric current.

Briefly summarized and expressed in a simpler wording than in the claims, but without restricting the scope of the claims, an idea underlying this embodiment of the inventive method may be briefly summarized as follows: One or more of the cords of a suspension member may be made part of a multi-phase alternating current circuitry by connecting it preferably in series with at least one of the legs of such multi-phase alternating current circuitry. Accordingly, at least one phase of a multi-phase alternating current is directed through this leg (or these legs) and therefore flows through the respective cord(s). One or more other phases of the same multi-phase alternating current are either directed through other cords of the same or other suspension members of the suspension member arrangement or are directed through one or more separate resistors by connecting these other cords or separate resistors electrically to at least one other leg of the multi-phase alternating current circuitry. Therein, the term "resistor" may be interpreted as representing any type of electrical load including for example load with electrical impedance. In other words, at least one of the phases of the multi-phase alternating current flows through a portion of the suspension member arrangement by being applied to at least one of its cords whereas at least one other phase may also flow through cords of the suspension member arrangement or may be directed through separate resistors. In such multi-phase arrangement, the phases of the multi-phase alternating current flow through the various legs of the multi-phase alternating current circuitry with a specific phase relationship. Generally, physical characteristics of the suspension member directly result in changes in its electrical characteristics, i.e. changes in electro-physical characteristics of e.g. cords in the suspension member may result from e.g. a change in the diameter of the cords, from any shorts or shunts, from breaks, etc. In case physical characteristics of the suspension member and electrical characteristics relating to such physical characteristics change over time, the phase relationship in a multi-phase alternating current will generally change. The change in such phase relationship may be measured relatively easily. In one approach, such phase relationship change may be determined by measuring an electric indicator current resulting as a net sum of all phases of the multi-phase alternating current. Such net sum directly depends on the phase relationship between the various phases such that changes in the net sum electric current allow deriving information about the electrical characteristics and therefore the deterioration state of the load bearing capacity of the suspension member arrangement. Alternatively to measuring the net sum of all phases of the multi-phase alternating current, an electrical bypass current through a neutral wire being connected in parallel to the multi-phase alternating current circuitry may be measured. Such bypass current through the neutral wire directly depends on the various phase currents flowing through the legs of the multi-phase alternating current circuitry. Therefore, a change in such bypass current may also enable deriving information about the electrical characteristics and therefore the deterioration state of the load bearing capacity in the suspension member arrangement. All these measurements do not require any direct or indirect measuring of resistances within the cords of a suspension member but it may be sufficient to measure an electric indicator current only.

Particularly, according to an embodiment, the deterioration state or the electrical characteristics relating to such deterioration state may be determined based on a deviation of the measured electric indicator current from a reference current value.

For example, an initial value of the measured indicator current may be determined upon installation of the suspension member arrangement in the elevator in a non-deteriorated state and such initial value can be taken as the reference current value. Alternatively, such reference current value may be determined based on other measurements, calculations and/or assumptions. During the operation of the elevator, the same or a corresponding indicator current may be measured with the multi-phase alternating current circuitry described herein. In case such subsequently measured indicator electric current substantially deviates from the reference current value, this may be taken as indicating a substantial deterioration in the load bearing capacity of the suspension member.

Particularly, according to an embodiment, a critical deterioration state or the electrical characteristics relating to such deterioration state may be detected upon the measured electric indicator current deviating from the reference current value by more than a predetermined difference value.

In other words, a specific difference value may be predetermined. For example, physical tests may be made in order to obtain information on how electrical characteristics of cords in a suspension member change upon physical stress and current values may be determined based on such physical tests. From such preceding experiments, the predetermined difference value may be derived such that, in later normal operation of the elevator, the electric indicator current being the indicator for the deterioration state may be repeatedly or continuously measured and a critical deterioration state may be assumed as soon as changes in this measured indicator current exceed the predetermined difference value. Upon detecting such critical deterioration state, counter-measures such as for example replacing the respective suspension member may be initiated.

According to an embodiment, the indicator current $I_n$ is measured using a measuring arrangement comprising a measuring device for contactless measuring of an electrical current in a conductor arrangement. The measuring device may be for example a current transformer or a Hall effect current sensor.

One possible option for contactless measuring of an electrical current is based on induction. Every electrical current in a conductor arrangement creates a magnetic field and changes in the current result in variations in the magnetic field which may then be used for inductively coupling the conductor arrangement in which the electrical current to be measured flows with a conductor arrangement of the measuring device. Contactless measuring of an electrical current enables a very simple measurement. For example, no direct physical connection needs to exist between the measuring device and the conductor arrangement. Instead, the measuring device may be arranged slightly spaced apart from the conductor arrangement in which the electrical current to be measured flows and/or may be electrically isolated therefrom.

In a specific embodiment, the electrical current may be measured using a measuring device being a current transformer or a Hall effect current sensor. Both, the current transformer and the Hall effect current sensor may measure the electric current in a conductor arrangement without physical contact. For example, a secondary winding of a current transformer may be arranged adjacent to the, or surrounding the conductor arrangement in which the electrical current to be measured flows such that changes in the electrical current induce an electrical current within the secondary winding. Accordingly, the electrical current in the conductor arrangement may be measured by measuring the current in the secondary winding and thus without having direct electric contact to the conductor arrangement.

According to an embodiment, the measuring device, i.e. the current transformer (CT) or the Hall effect current sensor, is arranged at the multi-phase alternating current circuitry or at the neutral wire connected in parallel to such circuitry. In this context, "arranged" shall mean that the measuring device is arranged close enough to the multi-phase alternating current circuitry or at the neutral wire such that the indicator current flowing through one of these components may be measured without contact by e.g. inductive coupling.

For example, a ring forming the secondary winding of the current transformer may enclose all legs of the multi-phase alternating current circuitry such that the net sum of all phases of the multi-phase alternating current transmitted through this circuitry may be measured. In such arrangement, a single secondary winding arrangement may enclose all legs of the multi-phase alternating current circuitry. Alternatively, the secondary winding arrangement of the current transformer may comprise several separate sub-winding arrangements, each sub-winding arrangement enclosing one of the legs of the multi-phase alternating current circuitry.

Alternatively, a secondary winding of the current transformer may enclose the neutral wire. As a current is induced in this neutral wire upon any changes in the phase relationship between phases of the multi-phase alternating current flowing through the various legs of the multi-phase alternating current circuitry, arranging the current transformer at the neutral wire by for example enclosing the neutral wire with the secondary winding of the CT may enable measuring an electric indicator current which is indicating any changes in the phase relationships in the multi-phase alternating current circuitry.

According to an embodiment, the multi-phase alternating current circuitry is provided in a Wye-configuration. Such Wye-configuration is sometimes also referred to as Y-configuration or star-configuration.

A Wye-configuration for the multi-phase alternating current circuitry may be beneficial as it may provide for common neutral points on a supply side and on a load side of the multi-phase alternating current circuitry such that a neutral wire may be provided by connecting to these neutral points. At such neutral wire, the electric indicator current may be measured particularly easily.

However, it is to be noted that three-phase alternating current circuitry may be configured in either, a Wye-configuration or a delta-configuration (Δ-configuration) and that any Wye-configuration may be reconfigured to result in a delta-configuration, and vice versa. It is also to be noted that multi-phase alternating circuits may be arranged with any number of phase circuit legs or branches, where electrical power is applied to each phase circuit branch and where the alternating voltage applied across each phase circuit branch may also have a phase-angle that differs between them at any moment in time.

According to an embodiment, the neutral wire is connected between common points of a supply side of the multi-phase alternating current circuitry and a load side of the multi-phase alternating current circuitry, respectively. In a neutral wire connected to such common points at the supply side and at the load side, an electric current flowing through the neutral wire will vary upon any change of a phase relationship of multiple phases of currents flowing through the various legs of the multi-phase alternating current circuitry. In multi-phase power generation systems, current flowing between the neutral point of the multi-phase power source and the neutral point of the electrical loads of each phase is commonly called the unbalanced load current.

According to an embodiment, each of the phases of the multi-phase alternating current is applied to at least one of the cords of the suspension member.

In other words, preferably none of the phases of the multi-phase alternating current is directed through a separate resistor only, this separate resistor not forming part of the suspension member. Instead, it may be preferable to transfer each of the phases of the multi-phase alternating current at least partially to one of the cords of the one or more suspension members of suspension member arrangement.

Accordingly, in such arrangement, for example temperature variations resulting in varying electrical characteristics of the cords may not significantly alter the phase relationship of the various phases of the multi-phase alternating current through the legs of the multi-phase alternating current circuitry as each cord, and therefore each of the legs, is subject to substantially the same temperature variations such that electrical characteristics will change in a same manner in all legs and will therefore at least partially be compensated.

According to an embodiment, in an initial state before deterioration, electrical resistances within each of the legs of the multi-phase alternating current circuitry are adapted to be substantially equal.

In other words, the multi-phase alternating current circuitry and, particularly, the way in that cords of the suspension member(s) are included in such circuitry may be designed such that substantially equal electrical resistances are included in each of the legs of the multi-phase alternating current circuitry. Due to such equal resistances, initially, a balanced current distribution throughout the legs of the multi-phase alternating current circuitry may be obtained.

In case, for example, electrical resistances provided by an inclusion of one or more conductive cords of the suspension member(s) into one or more of the legs of the multi-phase alternating current circuitry significantly differ between the various legs of the circuitry, additional separate resistors may be included in one or each of the legs in order to specifically adapt a total resistance throughout the one or each of the legs.

Therein, it may be sufficient to choose such additional resistors such that the total resistance throughout each of the legs of the circuitry is substantially equal. It may be emphasized that it is not necessarily required to know absolute values of the resistances of such additional resistors but it may be sufficient to adapt the addition of such resistors such that the phases of the multi-phase alternating current are applied to the cords, or to the legs comprising the cords, respectively, in an evenly distributed manner.

With such an initial state and phases of the multi-phase alternating current being distributed evenly throughout the various legs of the multi-phase alternating current circuitry, an initial configuration may be obtained in which the net sum current of all phases of the multi-phase alternating current as well as a potential electric bypass current through a neutral wire will be substantially zero. Accordingly, when repeatedly measuring one of these indicator currents during subsequent operation of the elevator, any deviation of the indicator current value from such initial zero value may easily indicate a change in the phase relationship between the phases throughout the legs of the circuitry and therefore a change in the deterioration state of the suspension member arrangement.

According to an embodiment, several cords of the suspension member are connected in a parallel arrangement and/or in a series arrangement or a combination of the two. In other words, several cords of a same suspension member, or between cords of different suspension members, may be connected in parallel with each other, may be connected in series to each other or some cords are connected in series to each other and some of such series connection are connected in parallel to each other. Each of the parallel or series arrangements or combinations thereof may have its own advantages, as described in further detail below.

According to a further embodiment, the suspension member arrangement comprises a plurality of suspension members and cords of one suspension member are connected in a parallel arrangement and/or in a series arrangement to cords of another suspension member. Again, both, the parallel arrangement and the series arrangement or a combination thereof may have its own specific advantages as described in further detail below.

According to an embodiment, the phases of the multi-phase alternating current are supplied with an even phase offset from each other. For example, the multi-phase alternating current may comprise two phases offset from each other by 180°. In another example, the multi-phase alternating current may comprise three phases offset from each other by 120°. An even offset between the phases of the multi-phase alternating current may contribute to a balanced current distribution throughout the legs of the multi-phase alternating current circuitry.

Further details of embodiments of such approach and its embodiments have been described by the applicant of the present application in previous patent applications and/or patents U.S. 62/199,375 and U.S. Ser. No. 14/814,558 which shall be incorporated herein in their entirety by reference. It shall be specifically noted that protection is or may be sought also for such features described in these previous applications and/or patents and that such features may contribute to achieving the technical aim of embodiments of the present invention and may thus be comprised in the solution of the technical problem underlying the invention which is the subject of the present application. Particularly, such features may implicitly clearly belong to the description of the invention contained in the present application as filed, and thus to the content of the application as filed. Such features are precisely defined and identifiable within the total technical information within the reference documents.

According to an embodiment of the present invention, the suspension member has a first and a second group of electrically conductive cords. Therein, the measuring of electrical characteristics comprises:

applying a first alternating voltage $U_1$ to a first end of the first group of cords of the suspension member;

applying a second alternating voltage $U_2$ to a first end of the second group of cords of the suspension member;

wherein the first and second alternating voltages have same waveforms and a phase difference of 180°;

determining at least one of
(i) a summed voltage $U_+$ correlating to a sum $(U_3+U_4)$ of a third voltage $U_3$ between a second end of the first group of cords and a common electrical potential and a fourth voltage $U_4$ between a second end of the second group of cords and the common electrical potential;
(ii) a differential voltage $U_-$ correlating to a difference between the third voltage $U_3$ and the fourth voltage $U_4$;

determining the electrical characteristics of the suspension member based on at least one of the summed voltage $U_+$ and the differential voltage $U_-$.

Preferably, the second end of the first group of cords and the second end of the second group of cords are electrically connected via a connecting electrical resistance ($R_S$). Preferably, the deterioration state is determined based on both the summed voltage $U_+$ and the differential voltage $U_-$.

Preferably, any deviation from a state in which the summed voltage $U_+$ comprises no alternating voltage component $U_{+,Ac}$ and the differential voltage $U_-$ comprises a alternating voltage component $U_{-,Ac}$ is interpreted as indicating a deterioration in the suspension member arrangement.

Without restricting the scope of the invention in any way, ideas underlying this embodiment of the inventive method may be understood as being based, inter alia, on the following recognitions and observations:

In conventional approaches for detecting a deterioration state (or electrical characteristics indicating same) of a load bearing capacity in a suspension member arrangement such as some of those approaches indicated in the above introductory portion, electrical characteristics of cords included in a suspension member have been taken as indicators for changes in the deterioration state. Generally, electrical resistances within the cords have been measured and it has been assumed that an increase of such electrical resistances indicates a deterioration of the load bearing capacity of the suspension member.

However, such electrical resistance measurements, or alternatively impedance measurements, may require substantial efforts in terms of, e.g., measuring devices, measurement analysing devices, circuitry, etc. For example, electrical resistances have to be included, measured and compared within circuitry comprising cords of a suspension member in order to thereby enable quantitative measurements of the electrical resistance or impedance of the cords.

It has now been found that measuring electrical resistance/conductivity of cords, particularly measuring quantitatively such characteristics, is not necessary in order to obtain sufficient information about a deterioration state of a load bearing capacity in a suspension member to ensure safe operation of an elevator.

As an alternative approach to conventional methods and devices, it is therefore proposed to not necessarily measure any electrical resistance, resistivity or impedance within conductive cords of a suspension member directly but to provide for a method and a device which allow for deriving sufficient information about a deterioration state by measuring one or more electric voltages which at least relate to a correlation of electric voltages occurring at ends of two groups of cords of the suspension member when alternating voltages are applied to opposite ends of these two groups of cords.

In such alternative approach, electrical resistances, resistivities or impedances do neither have to be known quantitatively on an absolute scale nor in a relative manner.

Instead, it may be sufficient to simply measure electric voltages, particularly sums of electrical voltages and/or differences of electrical voltages, without having any detailed knowledge about actual resistances, resistivities and/or impedances through the cords of the suspension member.

Briefly summarized and expressed in a simpler wording than in the claims, but without restricting the scope of the claims, an idea underlying the inventive method may be briefly summarized as follows:

The cords comprised in a suspension member may be divided into two groups of cords. Preferably, both groups comprise the same number of cords. Further preferably, a first group may comprise all even numbered cords and a second group may comprise all odd numbered cords, such that each cord of one of the groups is arranged between two neighbouring cords of the other group of cords (of course except for the two cords arranged at the outer borders of the suspension member).

Then, alternating voltages $U_1$, $U_2$ are applied to a respective first end of each of the groups of cords using an alternating voltage generator arrangement. The alternating voltages $U_1$, $U_2$ comprise an alternating voltage (AC) component in which a voltage periodically varies between a minimum value $U_{min}$ and a maximum value $U_{max}$. Furthermore, the alternating voltages $U_1$, $U_2$ may comprise a direct voltage (DC) component $U_{DC}$. The alternating voltage generator arrangement may comprise two separate alternating voltage generators $G_1$, $G_2$ which are synchronized in a specific manner with each other. Alternatively, the alternating voltage generator arrangement may comprise a single alternating voltage generator G comprising a direct output and an inverted output in order to provide the required two alternating voltages $U_1$, $U_2$. Therein, it may be important that the waveforms of both alternating voltages $U_1$, $U_2$ are substantially the same, i.e. deviate from each other by less than an acceptable tolerance, such tolerance being for example less than 5% or preferably less than 2%. Furthermore, the alternating voltage generator arrangement shall generate the two alternating voltages $U_1$, $U_2$ with a phase shift of substantially 180°, particularly with a phase shift of 180°±an acceptable tolerance of e.g. less than 5%, preferably less than 2%.

Then, at least one voltage measurement is performed using at least one voltage measurement arrangement. Specifically, a voltage named herein "summed voltage" $U_+$ and/or a voltage named herein "differential voltage" $U_-$ is determined. Both, the "summed voltage" $U_+$ and the "differential voltage" $U_-$ may be measured at least with their alternating voltage components $U_{+,AC}$, $U_{-,AC}$ but preferably with both, their alternating voltage components $U_{+,AC}$, $U_{-,AC}$ and their direct voltage component $U_{+,DC}$, $U_{-,DC}$. In the alternating voltage components $U_{+,AC}$, $U_{-,AD}$, both an amplitude and phase may be determined. As will be described further below, valuable information about the deterioration state of the suspension member may be derived particularly from the phase information included in the measurement of at least one of the alternating voltage components $U_{+,AC}$, $U_{-,AC}$.

Therein, the summed voltage $U_+$ correlates in a predetermined manner to a sum $(U_3+U_4)$ of a third voltage $(U_3)$ and a fourth voltage $(U_4)$ whereas the differential voltage $U_-$ correlates in a predetermined manner to a difference $(U_3-U_4)$ between the third voltage $(U_3)$ and the fourth voltage $(U_4)$. The third voltage $(U_3)$ occurs between the second end of the first group of cords and a common electrical potential such as e.g. a ground potential. The fourth voltage $(U_4)$ occurs between the second end of the second group of cords and the common electrical potential such as e.g. the ground potential.

The summed voltage $U_+$ and the differential voltage $U_-$ may be directly the sum $(U_3+U_4)$ and the difference $(U_3-U_4)$, respectively. Alternatively, the summed voltage $U_+$ may proportionally correlate to such sum $(U_3+U_4)$, i.e. may be a multiple of such sum such as e.g. $(U_3+U_4)/2$. Analogously, the differential voltage $U_-$ may proportionally correlate to the difference $(U_3-U_4)$, i.e. may be a multiple of such difference. As a further alternative, the voltage measurement arrangement may measure voltages $(U_1)$, $(U_2)$ occurring at opposite first ends of both groups of cords and may determine a sum $(U_1+U_2)$ and/or difference $(U_1-U_2)$ or a multiple of such sum/difference which, due to the fact that $(U_1)$, $(U_2)$ occur in the common circuitry with $(U_3)$, $(U_4)$, correlate in an unambiguous manner to the sum $(U_3+U_4)$ and to the difference $(U_3-U_4)$, respectively.

Information about the deterioration state of the suspension member or about electrical characteristics relating thereto may be derived from at least one of (i) a phase determination in the alternating voltage components $U_{+,AC}$, $U_{-,AC}$, of the summed voltage $U_+$ and/or the differential voltage $U_-$, (ii) an amplitude determination in the alternating voltage components $U_{+,Ac}$ $U_{-,Ac}$, of the summed voltage $U_+$ and/or the differential voltage $U_-$, and (iii) a value determination in the direct voltage components $U_{+,AC}$, $U_{-,DC}$, of the summed voltage $U_+$ and/or the differential voltage $U_-$.

In a normal state in which no deteriorations occur in the cords of the suspension member, both the third and fourth voltage $U_3$, $U_4$ should directly follow the applied alternating voltages $U_1$, $U_2$, i.e. with a same phase but with a reduced amplitude, and should therefore be both same in amplitude but with a phase shift of 180° such that the summed voltage $U_+$ should be a constant direct voltage (DC) (i.e. $U_{+,AC}=0$) and the differential voltage $U_-$ should be an alternating voltage (AC) (i.e. $U_{-,AC}\neq 0$) having double the amplitude than each of the third and fourth voltages $U_3$, $U_4$.

However, when any deterioration occurs in the cords of the suspension member, such as one or more local breakages of cords, significant corrosion of cords, defects in an electrically isolating cover enclosing and electrically separating neighbouring cords (such defects potentially resulting in shorts between neighbouring cords and/or electrical connections to ground of some cords), etc., the summed voltage $U_+$ and/or the differential voltage $U_-$ generally significantly change. Such changes may be detected and may then be interpreted as indicating specific types and/or degrees of deteriorations in the suspension member.

For example, an increase of an electrical resistance due to e.g. corrosion or even a breakage in one of the cords will significantly change a respective one of the third and fourth voltages $U_3$, $U_4$ occurring at the second end of the respective group of cords including the deteriorated cord. Accordingly, due to such voltage change, for example no purely direct voltage (DC) is measured anymore for the summed voltage $U_+$.

Other deteriorations of the suspension member and/or its cords generally result in other deviations of the summed voltage $U_+$ and/or the differential voltage $U_-$ from their initial "normal" behaviour, as will be described in more detail further below.

Accordingly, upon applying phase-shifted first and second voltages of same waveforms to first ends of two groups of cords, valuable information about a current deterioration state in the suspension member of the suspension member arrangement may be derived by measuring third and fourth voltages $U_3$, $U_4$ at or between the second ends of both groups of cords (or measuring any multiple thereof or any voltages correlating thereto) and correlating them as the sum (e.g. $U_3+U_4$) and/or the difference (e.g. $U_3-U_4$).

As will be described further below, additional information about a specific type, degree and/or location of an occurring deterioration may be derived when measurements of both the summed voltage $U_+$ and the differential voltage $U_-$ are taken into account.

A possible advantage obtainable with the approach described herein is that, in contrast to most prior art approaches, no electrical direct current (DC) is applied to the cords of a belt but, instead, alternating currents (AC) are applied. Applying such alternating currents may significantly reduce a risk of any electro-corrosion at the cords.

Further details of embodiments of the above approach have been described by the applicant of the present application in previous patent applications and/or patents EP 16 155 357 A1 and EP 16 155 358 A1 which shall be incorporated herein in their entirety by reference. It shall be specifically noted that protection is or may be sought also for such features described in these previous applications and/or patents and that such features may contribute to achieving the technical aim of embodiments of the present invention and may thus be comprised in the solution of the technical problem underlying the invention which is the subject of the present application. Particularly, such features may implicitly clearly belong to the description of the invention contained in the present application as filed, and thus to the content of the application as filed. Such features are precisely defined and identifiable within the total technical information within the reference documents.

According to a second aspect of the present invention, a monitoring arrangement for determining a deterioration state of e.g. a load bearing capacity in a suspension member arrangement for an elevator is proposed. The suspension member comprises a plurality of electrically conductive cords. The monitoring arrangement is configured to perform a method according to an embodiment of the above described first aspect of the invention.

Particularly, according to an embodiment of the present invention, the monitoring arrangement may comprise:

a counter device which is configured for counting a number of bending cycles applied to the suspension member based on information obtained from an elevator control device for controlling operation of the elevator;

an electrical measuring device which is electrically connected to at least one of the cords in the suspension member and which is configured for measuring an electrical characteristic of the suspension member upon applying an electrical voltage to the at least one of the cords; a determination device which is configured for determining at least one of
(a) a critical deterioration state of the suspension member (23) upon monitoring both: the counted number of bending cycles applied to the suspension member (11), and the determined electrical characteristic of the suspension member (11); and
(b) an unexpected deterioration state of the suspension member (23) based on deriving a current actual deterioration state of the suspension member based on the determined electrical characteristic and assuming a currently expected deterioration state based on the counted number of bending cycles and comparing the current actual deterioration state with the currently expected deterioration state.

For example, the determination device may be configured for determining a critical deterioration state of the suspension member upon each of:

an information indicating that the counted number of bending cycles applied to the suspension member as counted by the counter device exceeds an allowable maximum number, and an information indicating that the measured electrical characteristics of the suspension member as measured by the electrical measuring device deviates from a reference characteristics by more than an allowable maximum deviation.

In other words, the deterioration state of a suspension member in an elevator may be continuously or repeatedly monitored using a specific monitoring device. This device is, on the one hand, adapted for counting a number of bending cycles applied to the suspension member. Such counting may be performed using a specific counter device. On the other hand, the device is adapted for measuring electrical characteristics of the suspension member. The device may then, using for example its determination device, decide on whether or not a critical or unexpected deterioration state of the suspension member is actually present.

Such decision may be based for example on each of the information indicating that the number of counted bending cycles exceeds an allowable maximum number and the information indicating that the measured electrical characteristics of the suspension member deviates from reference characteristics by more than an allowable maximum deviation.

Alternatively, the determination device may for example verify whether an expected deterioration state of the suspension member which is assumed taking into account mainly the operational age of the suspension member (i.e. the number of bending cycles applied thereto) and the actual deterioration state of the suspension member as derived from its determined electrical characteristics correctly correspond to each other or not.

Each of the counter device, the electrical measuring device and the determination device may be connected to an elevator control controlling operation of the elevator and may receive data or information from such elevator control or may transmit its own data or information to the elevator control. Such data exchange connection may be established such using hardwiring or may be wireless.

Accordingly, for example the counter device may receive data or information from the elevator control relating to trips performed in the elevator such that the counter device may derive its required information for counting the number of bending cycles applied to the suspension member from such elevator control information. Similarly, the electrical measuring device may be connected to the elevator control such that it may for example take into account information or data from the elevator control when performing its own electrical measurements. The determination device may also be connected to the elevator control such that, for example, when a critical deterioration state of the suspension member is detected, such information may be transmitted to the elevator control such that the elevator control may then for example stop operation of the elevator, limit operation of the elevator, output an alarm or other information to users or operators of the elevator and/or initiate any other suitable countermeasures.

According to a third aspect of the present invention, an elevator is proposed. The elevator comprises the device according to an embodiment of the above described second aspect of the invention.

It shall be noted that possible features and advantages of embodiments of the invention are described herein partly with respect to a method for determining a deterioration state in a suspension member arrangement and partly with respect to a monitoring arrangement which is adapted for performing or controlling such method in an elevator. Some features are also described with reference to an elevator comprising such monitoring arrangement. One skilled in the art will recognize that the features may be suitably transferred from one embodiment to another, i.e. from the method to the device or vice versa, and features may be modified, adapted, combined and/or replaced, etc. in order to come to further embodiments of the invention.

In the following, advantageous embodiments of the invention will be described with reference to the enclosed drawings. However, neither the drawings nor the description shall be interpreted as limiting the invention.

DESCRIPTION OF THE DRAWINGS

FIG. 6 shows another example of an electrical measuring device for measuring electrical characteristics in a suspension member for a monitoring arrangement according to an embodiment of the present invention.

FIG. 7 visualizes electrical parameters to be induced or measured during measuring electrical characteristics of a suspension member with an electrical measuring device as shown in FIG. 6.

The figures are only schematic representations and are not to scale. Same reference signs refer to same or similar features throughout the figures.

DETAILED DESCRIPTION

Figure 1:
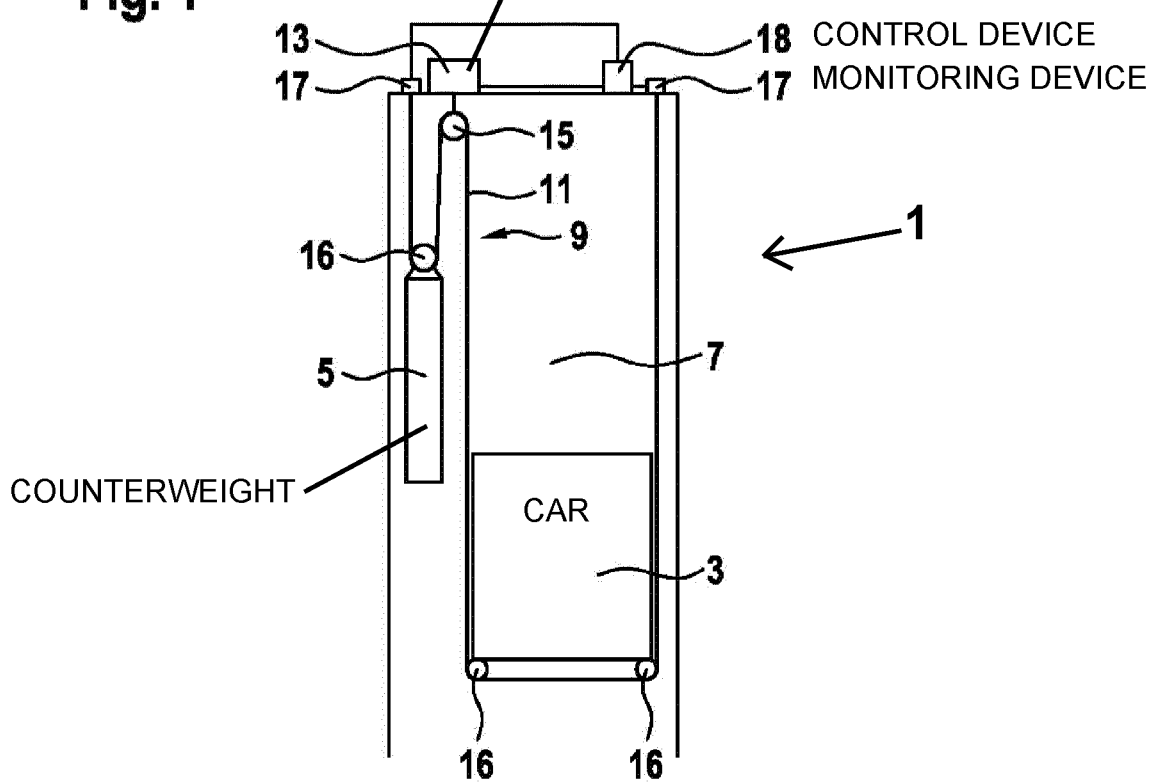
FIG. 1 shows an elevator in which a method according to an embodiment of the invention may be applied.

FIG. 1 shows an elevator 1 in which a method according to embodiments of the present invention may be implemented.

The elevator 1 comprises a car 3 and a counterweight 5 which may be displaced vertically within an elevator shaft 7. The car 3 and the counterweight 5 are suspended by a suspension member arrangement 9. This suspension member arrangement 9 comprises one or more suspension members 11, sometimes also referred to a suspension traction media (STM). Such suspension members 11 may be for example ropes, belts, etc. In the arrangement shown in FIG. 1, end portions of the suspension members 11 are fixed to a supporting structure of the elevator 1 at a top of the elevator shaft 7. The suspension members 11 may be displaced using an elevator traction machine 13 driving a traction sheave 15. The car 3 and the counterweight 5 may be held by the suspension members 11 by winding the suspension members 11 around pulleys 16. An operation of the elevator traction machine 13 may be controlled by a control device 18. For example at opposite end portions of the suspension member arrangement 9 components of a monitoring device 17 for determining a deterioration state in the suspension member arrangement 9 may be provided.

It may be noted that the elevator 1 and particularly its suspension member(s) 11 and its monitoring device 17 for determining the deterioration may be configured and arranged in various other ways than those shown in FIG. 1.

The suspension members 11 to be driven for example by the traction machine 13 may utilize metal cords or ropes to support a suspended load such as the car 3 and/or the counterweight 5 that is moved by the traction machine 13.

Figure 2:
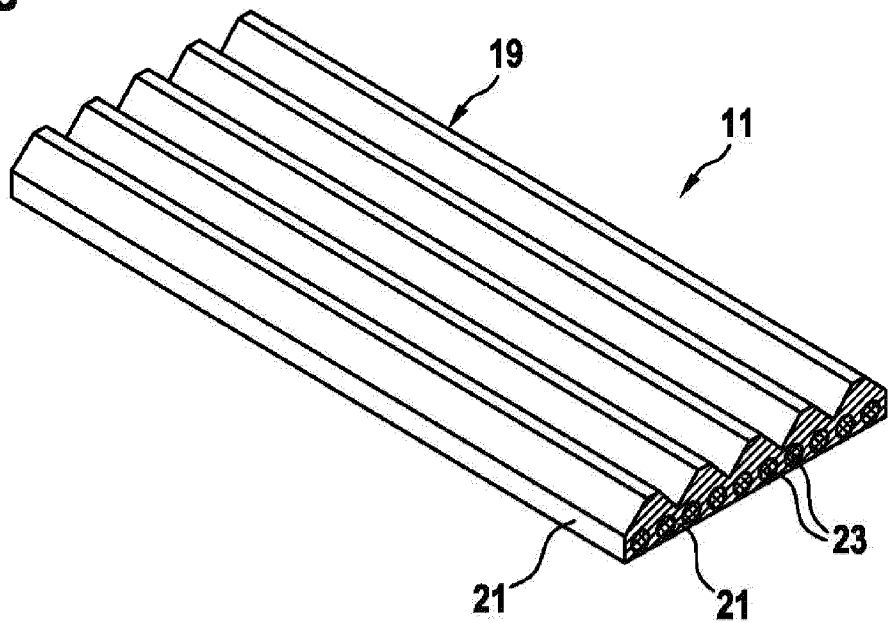
FIG. 2 shows an exemplary suspension member.

FIG. 2 shows an example of a suspension member 11 which is embodied with a belt 19. The belt 19 comprises a plurality of cords 23 which are arranged parallel to and spaced from each other. The cords 23 are enclosed in a matrix material 21 forming, inter alia, a coating or jacket. Such coating may mechanically couple neighbouring cords 23. The coating may have a textured or profiled surface including longitudinal guiding grooves. The cords 23 may typically consist of or comprise wires made from a metal such as steel. The matrix material 21 may consist of or comprises a plastic or elastomeric material. Accordingly, the cords 23 are typically electrically conductive such that an electric voltage may be applied to and/or an electric current may be fed through the cords without significant losses. Furthermore, the cords 23 are preferably electrically isolated from each other via the interposed electrically insulating matrix material 21 such that, as long as an integrity of the coating is not deteriorated, an electrical current or voltage between neighbouring cords cannot be transmitted, i.e. no significant shunt current can flow from one cord 23 to another.

Figure 3:
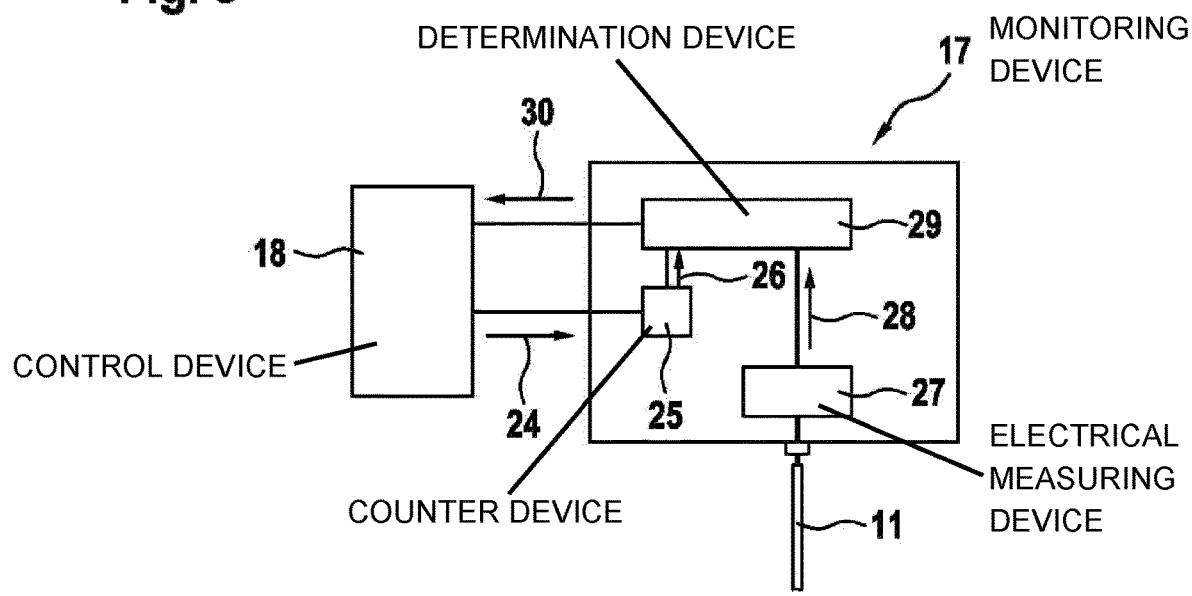
FIG. 3 shows an exemplary embodiment of a monitoring arrangement according to an embodiment of the present invention.
Figure 4:
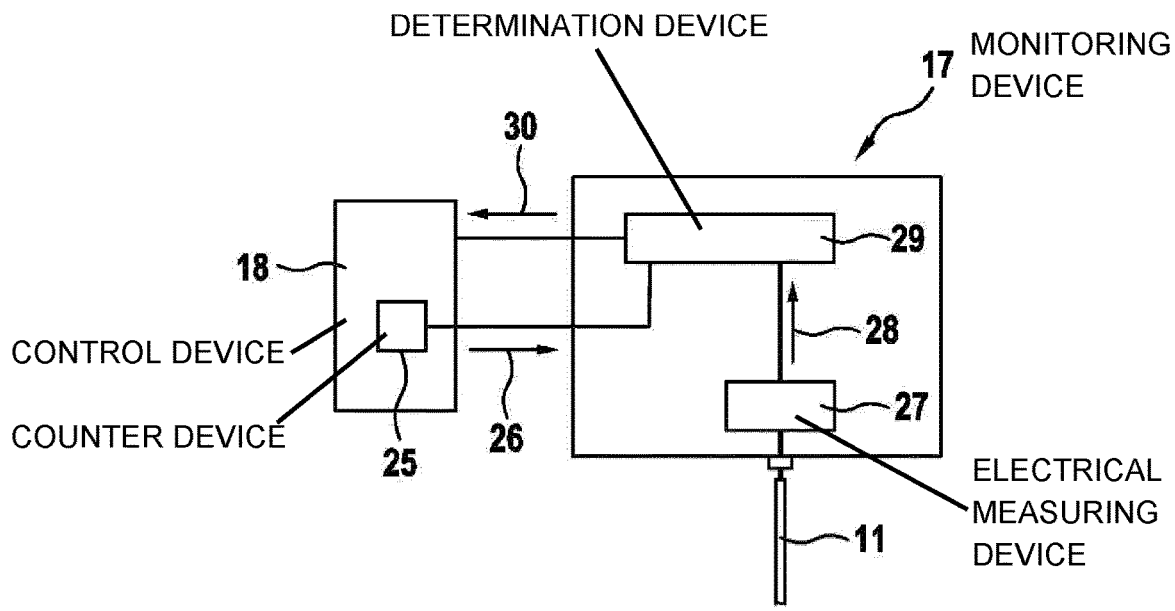
FIG. 4 shows an alternative exemplary embodiment of a monitoring arrangement according to an embodiment of the present invention.

FIGS. 3 and 4 show an exemplary embodiment of a monitoring arrangement including a control device 18 and a monitoring device 17 for determining the deterioration state in the suspension member 11 of the elevator 1. The monitoring arrangement (17+18) comprises a counter device 25, an electrical measuring device 27 and a determination device 29. These devices 25, 27, 29 may be implemented as separate units. Alternatively, these devices 25, 27, 29 may be integrated into one single unit. Also, the control device 18 and the monitoring device 17 may be embodied as separate devices, or may me embodied as a single device, e.g. all incorporated in an elevator control unit for controlling the overall functionality or operation of the elevator. In one embodiment, the control device 18 may be substantially identical to the elevator control unit, while in others, the control device 18 may be a part or subsystem of the elevator control unit. In further embodiments, the control device 18 may be separate from the elevator control unit. The individual parts may be distributed between the control device 18 and the monitoring device 17. Devices 25-29 may be embodied as distinct devices or units in hardware, while an embodiment as a computer program, thus as software within a computing unit, e.g. of an elevator control unit or within the control device 18 or the monitoring device 17 may be conceivable as well.

E.g. in FIG. 3, substantially all of the above indicated devices 25-29 are, at least logically, associated with the monitoring device 17. In FIG. 4, e.g. the counter device 25 may be, at least logically associated with the control device 18. Further, also the determination device 29.

In the exemplary embodiment of FIG. 3, the counter device 25 is connected to the elevator control device 18 such as to receive data or information from the control device 18 as visualised with the arrow 24. Such data or information may indicate for example whether or not the elevator is currently operated, i.e. whether or not the elevator traction machine 13 currently displaces the suspension member 11. Furthermore, the control device 18 may provide data or information correlating to a current position of the car 3 and/or the counterweight 5. Upon receiving such information, the counter device 25 may derive information allowing counting a number of bending cycles applied to the suspension member 11. For example, each time the suspension member 11 is displaced during a trip of the elevator 1 or each time a motion direction of the elevator is reversed, the number of bending cycles applied to the suspension member 11 is incremented. In other words, one alternative to increment the number of bending cycles may be embodied as a trip counter, even if successive trips are in the same direction of elevator/car motion, while another alternative is to only count, thus increment a bending cycle counter, if the direction of motion changes. This may be applied when counting bending cycles for the whole suspension member 11 or also during the sectional approach.

Preferably, the counter device 25 does not simply act like a trip counter. To the contrary, by for example taking into account the provided information about the current position of the car 3 and the counterweight 5, additional information may be derived indicating locations at which the suspension member 11 is currently being bent. Accordingly, the counter device 25 may be enabled to not simply count bending cycles for the suspension member 11 in its entirety but, instead, may count section bending cycles applied to each section of a multiplicity of sections forming the entire suspension member 11. For example, one section of the suspension member may correspond to a portion of the suspension member extending between two neighbouring floors of a building. Principles, further details and possible advantages of such preferred counter device 25 and the method for counting bending cycles performed thereby are disclosed in the applicant's earlier patent applications WO 2010/007112 A1 and EP 2 303 749 B1 which shall be incorporated herein in their entirety by reference.

The counted number of bending cycles applied to the suspension member 11 is provided from the counter device 25 to the determination device 29, as indicated with the arrow 26.

The electrical measuring device 27 is electrically connected to the suspension member 11. For example, the electrical measuring device 27 comprises a voltage source for generating an electric voltage V and applying such electric voltage V to one or several cords 23 of the suspension member 11. Preferably, the voltage source is adapted for generating two or more phases of an alternating voltage, these phases being shifted relative to each other and each phase being applied to one or a group of cords 23 or, alternatively, to a separate resistor. As further detailed below, the electrical measuring device 27 may measure electrical characteristics of the suspension member by applying the electrical voltage to at least one of the cords 23 and by then monitoring electrical parameters in the cords 23.

The electrical measuring device 27 may then provide the information about the electrical characteristics of the suspension member 11 to the determination device 29 as indicated with the arrow 28.

The determination device 29 may use the information/data from the counter device 25 and the electrical measuring device 27 for determining whether a critical deterioration state is present in the suspension member 11.

The presence of such critical deterioration state is assumed in case the counted number of bending cycles provided by the counter device 25 exceeds an allowable maximum number. For example, such allowable maximum number of bending cycles may be predetermined as a result of experiments performed with an exemplary non-deteriorated suspension member under normal operation conditions. In such experiments, it is repeatedly tested after having bent the suspension member multiple times whether or not the suspension member still has a sufficient load bearing capacity of more than 60% or more than 80% of its initial value. Typically, an allowable maximum number of bending cycles is determined from such experiments to be in a range of 15 million to 20 million bending cycles but may also be higher or lower, dependent e.g. from specific operating conditions and/or characteristics of a specific type of suspension member 11. Accordingly, at the latest after such allowable maximum number of bending cycles has been counted for the present suspension member 11, the determination device 29 will assume that the repeated bendings will have deteriorated the suspension member 11 to a degree such that a critical deterioration state has been reached and, typically, the suspension member 11 should be replaced.

As a second decisive parameter, the determination device 29 takes into account the electrical characteristics measured and provided by the electrical measuring device 27. As long as these electrical characteristics do not deviate excessively from reference characteristics, it is assumed that the suspension member 11 is operated under normal operation conditions, i.e. not for example damaged or corroded beyond a normal state. As long as this is true, the determination device 29 will base its decision whether or not the suspension member 11 can be further operated only on the determination of whether or not the suspension member 11 has been bent more than the allowable number of bending cycles. However, as soon as this is not true, i.e. electrical characteristics are measured in the suspension member 11 which deviate from the reference characteristics by more than the allowable maximum deviation, it may be assumed that significant deterioration or damage occurred to the suspension member 11 which cannot only be attributed to repeated bendings thereof. Based on the specific type of deviation from the reference characteristics, the determination device 29 may then decide whether this deviation indicates a critical deterioration state upon which operation of the elevator 1 should be directly stopped or whether other countermeasures should be initiated.

FIG. 4 shows an alternative embodiment of a monitoring arrangement 17 for determining the deterioration state in the suspension member 11 of the elevator 1. Therein, while still forming part of the monitoring arrangement 17, the counter 25 is no more included in a same housing as the determination device 29 and the electrical measuring device 27 but forms part of the elevator control device 18. Typically, in such control device 18, a number of elevator trips or a number of motion reversals upon such trips is counted and such information may be provided to the determination device 29 as indicated with the arrow 26.

Further e.g., the control device 18 may equal the elevator control unit. Such elevator control unit may (already) comprise a counter device 25 for counting trips, bending cycles and/or sectional bending cycles. Here, monitoring device 17 may only provide a signal/information as indicated with the arrow 30 to the elevator control being indicative of the determined electrical characteristic as such or being indicative of a current actual deterioration state of the suspension member. Said information may be provided to the control device 18/the elevator control unit, which in turn evaluates the signal/information, respectively, and conducts the method of the invention within the control device 18/the elevator control unit. As such, it is also feasible that the determination unit 29 is, at least logically, associated with/arranged within the control device 18/the elevator control unit. The determination unit 29 may even be a computing part within the control device 18/the elevator control unit, e.g. being embodied in the control program of the control device 18/the elevator control unit. In such an embodiment, the signal/information as indicated with the arrow 26 may not be present at all or may be a simple indication to the monitoring device 17 that a determination of an electrical characteristic shall be performed.

Figure 5:
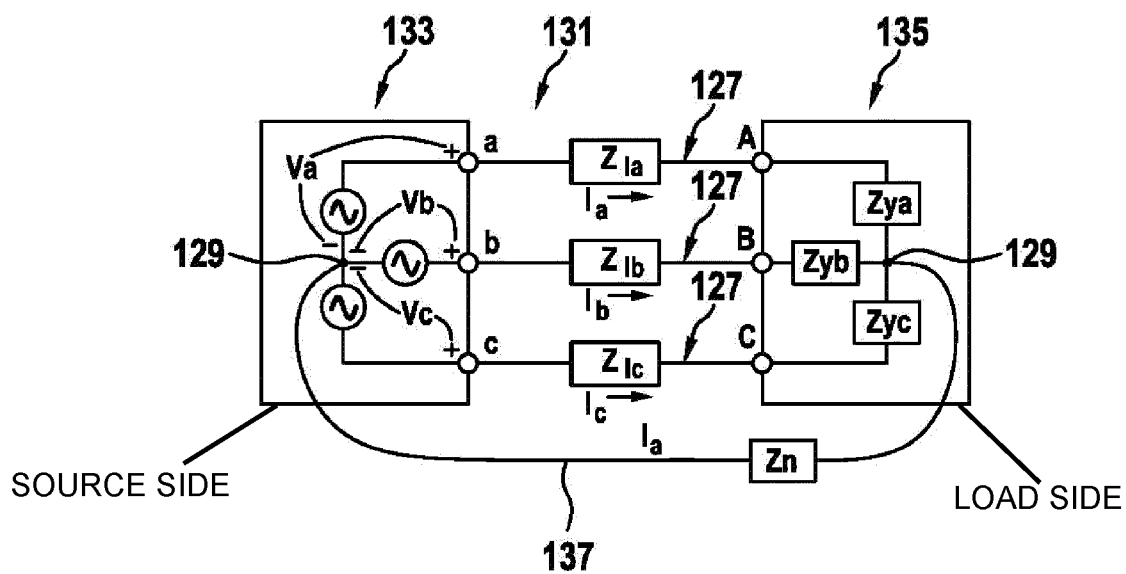
FIG. 5 shows an example of an electrical measuring device for measuring electrical characteristics in a suspension member for a monitoring arrangement according to an embodiment of the present invention.

In FIGS. 5 and 6, possible principles and features to be implemented in examples of an electrical measuring device 27 are briefly explained. However, it shall be mentioned that such principles and features are explained in significantly more details in the applicant's prior patent applications U.S. 62/199,375 and U.S. Ser. No. 14/814,558 (for the implementation shown in FIG. 4) and EP 16 155 357 A1 and EP 16 155 358 A1 (for the implementation shown in FIG. 5). Accordingly, reference is made to these prior patent applications, the disclosure of which shall be incorporated in its entirety into the disclosure of the present invention.

FIG. 5 shows an example of a multi-phase alternating current circuitry 131 comprising three electrically conductive legs 127 wherein both, a source side 133 and a load side 135 are configured in a Wye-configuration. Alternating voltage sources Va, Vb, Vc are provided in a Wye-configuration at the source side 133. Resistors Zya, Zyb, Zyc are provided in a Wye-configuration at the load side 135. Both Wye-configurations have a neutral point 129 at which the voltage sources Va, Vb, Vc or the resistors Zya, Zyb, Zyc, respectively, are all interconnected. The alternating voltage sources Va, Vb, Vc are connected via the lines a, b, c forming the legs 127 to associated ones of the resistors Zya, Zyb, Zyc. Accordingly, current phases Ia, Ib, Ic of a multi-phase alternating current may be applied to each line a, b, c of the legs 127.

Furthermore, in the exemplary multi-phase alternating current circuitry 131 of FIG. 5, a neutral wire 137 is connected to each of the neutral points 129 at the Wye-configuration at the source side 133 and the Wye-configuration at the load side 135. In other words, the neutral wire 137 is connected between the common points 129 of the supply side and the load side of the multi-phase alternating current circuitry, respectively. The neutral wire 137 comprises a resistance Zn. In the neutral wire, a bypass current $I_n$ may flow.

A multi-phase alternating current comprises at least two phases wherein in each phase the current alternates over time. There is a phase-shift between the phases such that for example a peak current strength in one phase is shifted by 2 π/n (n=2, 3 4, . . . ) with respect to a peak current strength of another phase. The currents may alternate for example in a sinusoidal manner. However, also other alternation patterns, such as digital, stepwise, or others, may be applied.

In other words and in the example of three phases, in electrical circuit design, three-phase electric circuits generally have three conductors for example formed by lines a, b, c carrying voltage waveforms that are 2 π/3 radians (i.e. 120° or ⅓ of a cycle) offset in time.

Where the three conductors carrying the voltage waveforms are "balanced", a net sum of phase currents throughout all legs 127 of the multi-phase alternating current circuitry 131, i.e. a vector sum of Ia, Ib, Ic is 0 (i.e. Ia+Ib+Ic=0, wherein Ia, Ib, Ic shall be vector currents and thus include vector information about their phases). In a balanced three-phase circuit, all three sources Va, Vb, Vc are generally represented by a set of balanced three-phase variables and all loads Zya, Zyb, Zyc as well as lines a, b, c within the legs 127 of the circuitry have equal impedances. Furthermore, in such balanced circuit, not only the net sum of the phase currents is 0, but also an electric bypass current In through the neutral wire 137 being connected in parallel to the legs 127 is 0 (i.e. In=0).

Following Kirchhoff's voltage law, when there is an imbalance in the conductor loads of the three-phase circuit, any resulting imbalance of phase currents in the legs 127 of the circuitry 131 will be resolved as a current In in the neutral wire 137 and/or as a net sum phase current throughout all phases a, b, c of the multi-phase alternating current being no more equal to 0.

Such deviation of the bypass current $I_n$ through the neutral wire 137 or of the net sum of all other phase currents $I_a$, $I_b$, $I_c$ may be interpreted and named herein as "electric indicator current". As soon as this indicator current deviates from a reference current value by more than a predetermined difference value, this may be taken as signal indicating that critical deterioration has occurred within at least one of the suspension members and checking and, if necessary, replacing the suspension member may be initiated for example. The reference current value may be, for example a current value of the bypass current $I_n$ or a net sum of the phase currents Ia, Ib, Ic measured with a non-deteriorated suspension member arrangement such as for example directly after fabrication or installation of a suspension member arrangement.

The indicator current may be measured in various ways. For example, a vector net sum of all currents $I_a$, $I_b$, $I_c$ throughout all of the legs 127 of the multi-phase alternating current circuitry 131 may be measured together, i.e. with a common measuring circuitry. Alternatively, each of the phase currents $I_a$, $I_b$, $I_c$ in the lines a, b, c forming the legs 127 may be measured separately and a net sum of these separately measured phase currents may then be determined subsequently, for example in a summing device. Alternatively, the indicator current may be derived from the bypass current $I_n$ flowing through the neutral wire 137 upon any imbalance within the multi-phase alternating current circuitry 131.

For example, with reference to the circuitry 131 shown in FIG. 5, voltages Va, Vb, Vc are applied to lines a, b, c forming the legs 127 and are held constant, i.e. equal to each other, and 2 π/3 radians shifted apart. At least one of the lines a, b, c may comprise at least one of the cords comprised in a suspension member of the suspension member arrangement of the elevator. For a net sum $(I_a+I_b+I_c)$ and/or a bypass current $I_n$ in the neutral wire 137 to be equal to 0 under initial conditions, such as when the suspension member is newly installed, voltage drops across each of the lines a, b, c plus voltage drops across each of the loads Zya, Zyb, Zyc in each of the legs 127 must be equal.

In practical terms, the voltage drops across for example steel cords in a suspension member will not necessarily be initially equal due to for example various small differences and tolerances created by for example manufacturing tolerances of the steel cords in the suspension member. In this case, the loads Zya, Zyb and Zyc may be adjusted to compensate for such differences until a desired initial current condition for $I_n$=0, i.e. no current flow in the neutral wire, is obtained. Alternatively the multi phase source voltages Va, Vb, Vc 33 may be independently adjusted to likewise establish a desired initial current condition for In. Intuitively for those skilled in the art, an alternative to adjusting the loads Zya, Zyb, Zyc and/or the multi phase source voltages Va, Vb, Vc for an initial zero In current would be to capture a non-zero value of $I_n$ as the initial reference current value.

Suspension members that contain multiple metal cords are generally capable of having the cords acting as electrical conductors or lines. The suspension member may also be construed with metal cords that are isolated electrically from each other by a physical separation, such as with electrically non-conductive materials like an elastomeric coating. Where the metal cords in suspension members are electrically isolated from each other, they may be connected for example in a Wye-configuration or a Delta-configuration and be part of various legs of a multi-phase alternating current circuitry. Each of the cords may then become an electrical conductor in the circuitry.

For example, in a Wye-configuration of FIG. 5, three isolated cords in a suspension member are represented by ZIa, ZIb, ZIc. In an initially balanced state, the sums of resistances ZIx+Zyx (x=a, b, c) in each of the lines a, b, c formed by the cords are substantially equal. However, upon deterioration of one of the cords, the resistance ZIx created thereby in one of the lines changes and the entire multi-phase alternating current circuitry 131 comes into imbalance. Such imbalance may then be determined by measuring the indicator current $I_n$ or $(I_a+II_b+I_c)$. If this indicator current exceeds a certain predetermined value, this may be taken as indication that at least one of the cords comprised in a suspension member is significantly deteriorated and the suspension member may have to be checked and/or replaced.

Instead of forming all lines a, b, c or, more generally, all legs 127 of a multi-phase alternating current circuitry 131 by including one of the cords of a suspension member, for example only one or a few of those lines may include cords of the suspension member. For example, as described further below with respect to various examples, all cords of a suspension member or of plural suspension members may be connected in series or in parallel and may be included into only one of the legs 127 whereas the other legs 127 do not comprise any cords but are formed only with the loads Zyx. These loads Zyx may be fixed or dynamic. For example, dynamic loads may be implemented for setting up initial conditions for In and/or compensating any temperature effects modifying electrical characteristics in the loads Zyx, the lines a, b, c, the cords comprised in the multi-phase circuitry and/or other components of the multi-phase circuitry.

It may be noted that setting up initial conditions for In and/or compensating for the effects of temperature or other phenomena may also be accomplished by dynamically adjusting the loads Zya, Zyb, Zyc and/or the multi phase source voltages Va, Vb, Vc.

As indicated above, further details of the approach for measuring electrical characteristics in suspension members 11 as briefly explained herein with respect to FIG. 5 are explained in the applicant's prior patent applications U.S. 62/199,375 and U.S. Ser. No. 14/814,558.

FIG. 6 shows an exemplary embodiment of a device 217 for detecting a deterioration state in a suspension member arrangement 9 for an elevator 1. Therein, the suspension member arrangement 9 may comprise one or more suspension members 11 such as for example belts as shown in FIG. 2 including a plurality of electrically conducting cords 223. In FIG. 6, the cords 223 are only indicated schematically as twelve elongate cords 223 being arranged parallel to each other.

The multiplicity of cords 223 may be divided into two groups 224a, 224b of cords. For example, a first group 224a of cords may comprise all odd numbered cords 223 whereas a second group 224b of cords may comprise all even numbered cords 223.

The device 217 comprises an alternating voltage generator arrangement G which is adapted for applying a first alternating voltage $U_1$ to a first end 225a of the first group 224a of cords 223 and for applying a second alternating voltage $U_2$ to a first end 225b of the second group 224b of cords 223.

In the embodiment shown in FIG. 6, the alternating voltage generator arrangement G comprises a first alternating voltage generator $G_1$ and a second alternating voltage generator $G_2$. The two alternating voltage generators $G_1$, $G_2$ may be separate devices and may operate in principle independently from each other. However, the two alternating voltage generators $G_1$, $G_2$ should be synchronized such as to operate with a stationary phase relationship with respect to each other.

The alternating voltage generators $G_1$, $G_2$ are electrically connected, on their one side, to an electrical ground potential, whereas, on their other side, they are electrically connected to the first ends 225a, 225b of the first and second groups 224a, 224b of cords 223, respectively. The alternating voltage generators $G_1$, $G_2$ generate first and second generated voltages $U_{G1}$, $U_{G2}$, respectively.

An internal electrical resistance of each of the alternating voltage generators $G_1$, $G_2$ is represented in FIG. 6 by $R_3$, $R_4$. Due to such internal resistances $R_3$, $R_4$, the actual first and second voltages $U_1$, $U_2$ applied to the cords 223 may generally be lower than the generated voltages $U_{G1}$, $U_{G2}$ generated by the alternating voltage generators $G_1$, $G_2$ themselves.

The alternating voltage generator arrangement G with its alternating voltage generators $G_1$, $G_2$ is configured to generating the first and second alternating voltages $U_1$, $U_2$ with same waveforms and with a fixed phase difference of essentially 180°. Therein, the waveforms should differ from each other at most by an acceptable tolerance of for example less than 5% and the phase difference should differ from 180° at most by an acceptable tolerance of for example less than 10°, preferably less than 5° or less than 2°.

In examples and embodiments described herein below, it will be assumed that the alternating voltage generator arrangement G has a specific exemplary implementation in which it generates first and second generated voltages $U_{G1}$, $U_{G2}$ having an amplitude of 6 V and oscillating around a DC voltage of 6 V. In other words, the first and second generated voltages $U_{G1}$, $U_{G2}$ oscillate between $U_{min}$=0 V and $U_{max}$=12 V. Therein, the waveform is sinusoidal. An oscillation frequency is selected to be 280 Hz. The internal resistances $R_3$, $R_4$ are selected to be 450 Ohm.

However, it shall be noted that the alternating voltage generator arrangement G may be implemented in various other manners. For example, the first and second generated voltages $U_{G1}$, $U_{G2}$ may be generated with other waveforms such as rectangular waveforms or triangular waveforms. Furthermore, the amplitude and/or frequency of the first and second alternating generated voltages $U_{G1}$, $U_{G2}$ may be selected in various other manners. For example, the generated voltages $U_{G1}$, $U_{G2}$ may oscillate between other minimum and maximum voltages $U_{min}$, $U_{max}$. Specifically, the alternating voltages do not necessarily have to oscillate around a fixed non-zero DC voltage but may also oscillate around 0 V, i.e. oscillate between a negative voltage—$U_{max}$ and a positive voltage $+U_{max}$. Such implementation may be advantageous with respect to electro-corrosion characteristics.

Furthermore, the internal resistances $R_3$, $R_4$ may be selected in various manners and may be specifically adapted to a specific application, for example depending on electrical resistances generated by the cords 223 to which the first and second alternating voltages $U_1$, $U_2$ shall be applied.

Furthermore, instead of providing the alternating voltage generator arrangement G with two separate alternating voltage generators $G_1$, $G_2$, a single alternating voltage generator may be provided and this single alternating voltage generator may provide for a direct output and an inverse output such that alternating generated voltages $U_{G1}$, $U_{G2}$ may be output with a phase-shift of 180°. For example, such single alternating voltage generator may be coupled to a transformer including for example a primary and a secondary coil wherein an inverse output voltage may be generated at a contact in a middle of the secondary coil, such inverse voltage output being shifted by 180° to a direct voltage output generated at outer contacts of the secondary coil. In such embodiment, the first and second alternating voltages $U_1$, $U_2$ are automatically synchronized with a stationary phase-shift of 180° such that, for example, no specific synchronization of two separate alternating voltage generators $G_1$, $G_2$ is required.

The first alternating voltage $U_1$ is applied to the first end 225a of the first group 224a of cords 223 of a suspension member 11 whereas the second alternating voltage $U_2$ is applied to a first end 225b of the second group 224b of cords 223 of the same suspension member 11. Within one group of cords 224a, 224b, all cords 223 comprised in this group 224a, 224b may be electrically connected to each other.

Preferably, the cords 223 of one group 224a, 224b are connected in series. In such series connection, for example all odd numbered cords 1, 3, 5, etc. are electrically connected in series to each other such as to form a kind of long single electrical conductor. Similarly, all even numbered cords 2, 4, 6, etc. may be connected in series. In such implementation, the first alternating voltage $U_1$ may be applied for example to a first end 225a of the first group 224a of cords 223 being formed by a free end of a cord 223 number 1, an opposite end of this cord number 1 being electrically connected in series to an end of a cord number 3, an opposite end of this cord number 3 again being electrically connected to a free end of a cord number 5 and so on. Accordingly, a second end 227a of this first group 224a of cords 223 is formed by a free end of a last odd numbered cord 223. Similarly, all even numbered cords 223 may be connected in series such as to electrically connect a first end 225b of this second group 224b of cords 223 to an opposite second end 227b via a single long conductor formed by the series of even numbered cords 223. In such series connection arrangement, both alternating voltages $U_1$, $U_2$ applied to first ends 225a, 225b of both groups 224a, 224b of cords 223 are transferred throughout the entire series connections formed in both groups 224a, 224b by the respective cords 223 comprised therein. Accordingly, when no electric current flows, the first and second alternating voltages $U_1$, $U_2$ also apply to the second ends 227a, 227b of both groups of cords 224a, 224b. However, in case any electric current is flowing through the cords 223 as a result of the applied alternating first and second voltages $U_1$, $U_2$, such current has to be transferred through the respective group 224a, 224b of cords 223 and thus experiences electrical resistances created by the respective cords 223. As a result, voltage drops occur throughout the respective cords 223. Accordingly, by measuring third and fourth voltages $U_3$, $U_4$ at opposite second ends 227a, 227b of each group 224a, 224b of cords 223, information about a condition within the groups 224a, 224b of cords 223 may be derived as it may be for example determined whether any electric current flows through the cords 223 in each of the groups 224a, 224b and, if this is the case, how such current "behaves".

In order to connect the alternating voltage generator arrangement G to the suspension member and suitably interconnecting all cords 223 in advantageous series connections, a connector arrangement (not shown in FIG. 6 for clarity of visualization) for establishing a series connection of all even numbered cords in the suspension member and a series connection of all odd numbered cords in the suspension member and for establishing an electrical connection for applying the first and second alternating voltages ($U_1$, $U_2$) to first ends of the series connection of even numbered cords and the series connection of odd numbered cords, respectively, may be provided.

As a side note only, it shall be noticed that the first and second groups 224a, 224b of cords 223 may be arranged and electrically connected in various other ways. For example, while it may be advantageous to include all even numbered cords and all odd numbered cords in one of the groups 224a, 224b of cords 223, respectively, it may also be possible to include each of the cords 223 of one or more suspension members 9 in other configurations to the two groups 224a, 224b of cords 223. For example, all cords 1 to n may be comprised in the first group 224a, whereas all cords n+1 to x may be comprised in the second group of cords 224b. Preferably, both groups 224a, 224b of cords 223 comprise a same number of cords 223. Furthermore, while it may be beneficial to connect all cords 223 of one group 224a, 224b in series to each other, also parallel electrical connections of all or some of the cords 223 comprised in one of the groups 224a, 224b may be possible.

At the second ends 227a, 227b of both groups 224a, 224b of cords 223, a first voltage measurement arrangement 231 and/or a second voltage measurement arrangement 233 may be provided as forming part of a determination unit 229. These components 229, 231, 233 are shown in FIG. 5 only in a schematic manner.

The first voltage measurement arrangement 231 may be adapted for determining a summed voltage $U_+$ which correlates to a sum of a third volume $U_3$ and a fourth voltage $U_4$. Therein, the third voltage $U_3$ applies between the second end 227a of the first group 224a of cords 223 and a common electrical potential such as a ground potential. The fourth voltage $U_4$ applies between a second end 227b of the second group 224b of cords 223 and the common electrical potential.

The second voltage measurement arrangement 233 is adapted for determining a differential voltage $U_-$ correlating to a difference between the third voltage $U_3$ and the fourth voltage $U_4$.

Therein, both the summed voltage $U_+$ and the differential voltage $U_-$ shall "correlate" to the sum and difference, respectively, of $U_3$ and $U_4$ in an unambiguous manner. For example, the summed voltage $U_+$ may be equal to the sum $U_3+U_4$ and the differential voltage $U_-$ may be equal to the difference $U_3-U_4$. Alternatively, the summed voltage $U_+$ and/or the differential voltage $U_-$ may correlate to such sum $U_3+U_4$, $U_3-U_4$, respectively, in other manners such as being for example a multiple thereof. For example, $U_+$ may be equal to $x*(U_3+U_4)$ and/or $U_-$ may be equal to $y*(U_3-U_4)$, x and y being possibly any rationale number, for example $x=y=½$ or $x=y=2$, etc.

In principle, it may be sufficient to provide the device 217 with only one of the first and second voltage measurement arrangements 231, 233 as already from such single voltage measurement arrangement determining only the summed voltage $U_+$ or the differential voltage $U_-$, some useful information about a current deterioration state of the suspension member 11 may be derived. However, in order to obtain more useful information about the deterioration state, it may be beneficial to provide the device 217 with both the first voltage measurement arrangement 231 and the second voltage measurement arrangement 233 in order to enable for example distinguishing between various types or degrees of deterioration within the suspension member 11.

In the embodiment shown in FIG. 6, the device 217 is provided with both the first and second voltage measurement arrangements 231, 233. Therein, the two voltage measurement arrangements 231, 233 are implemented by including a first and a second voltage determining unit 235*a*, 235*b*. These voltage determining units 235*a*, 235*b* and/or other voltage determining units comprised in voltage measurement arrangements of the device 217 may be e.g. electronic devices which are adapted for electronically and preferably automatically measure electric voltages within a circuitry. Therein, the first voltage determining unit 235*a* is connected on its one side to the second end 227*a* of the first group 224*a* of cords 223 whereas the second voltage determining unit 235*b* is connected with one side to the second end 227*b* of the second group 224*b* of cords 223. An opposite side of both voltage determining units 235*a*, 235*b* is connected to an electric ground potential. Accordingly, the first and second voltage determining units 235*a*, 235*b* are adapted for measuring the third voltage $U_3$ and the fourth voltage $U_4$, respectively. Both voltage determining units 235*a*, 235*b* are then connected to the determination unit 229 in which the first voltage measurement arrangement 231 is adapted for determining the summed voltage $U_+$ and the second voltage measurement arrangement 233 is adapted for determining the differential voltage $U_-$.

Additionally to the components of the circuitry explained herein before to be used during actually measuring the summed voltage and the differential voltage, the device 217 shown in FIG. 6 comprises a pull-up voltage source 236. This pull-up voltage source 236 may apply a constant DC voltage to both first ends 225*a*, 225*b* of both groups 224*a*, 224*b* of cords 223 during an idle mode in which the alternating voltage generator arrangement G is deactivated or couple-off. Such idle mode will be described further below. The constant DC voltage may be substantially equal to the maximum voltage $U_{max}$ of the alternating generated voltages $U_{G1}$, $U_{G2}$ generated by the alternating voltage generator arrangement G. The pull-up voltage source 136 comprises internal electrical resistances $R_1$, $R_2$.

Furthermore, the device 217 may comprise a third and a fourth voltage determining unit 235*c*, 235*d* for measuring the first and second voltages $U_1$, $U_2$, respectively. Depending on the current flowing through the entire circuitry of the device 217, voltage drops at the internal resistances $R_3$, $R_4$ of the alternating voltage generator arrangement G may differ such that the first and second voltages $U_1$, $U_2$ may differ accordingly. Thus, by measuring the first and second voltages $U_1$, $U_2$ with third and a fourth voltage determining unit 235*c*, 235*d*, information about the electrical current flowing through the circuitry may be derived. This information then includes information about the deterioration state of the suspension member 11 as the electrical current flowing through the circuitry strongly depends on electrical resistances occurring within the cords 223 of the suspension member 11.

Next, a function principle of the device 217 and a method for detecting a deterioration state in a suspension member arrangement 9 performed thereby shall be described in an exemplary manner for a state where the suspension member 11 is non-deteriorated, i.e. neither the cords 223 nor the cover 21 is deteriorated or even damaged in any manner and therefore all cords 223 have same physical and electrical characteristics. Voltages, which are generated or which are measured during such method will be described with reference to FIG. 7.

In the method for monitoring the deterioration state, the alternating voltage generator arrangement G generates two alternating voltages $U_{G1}$, $U_{G2}$ which alternate in a sinusoidal manner with a frequency of 280 Hz and an amplitude of 6 V around a base direct voltage of 6 V. Such generated voltages $U_{G1}$, $U_{G2}$ result in first and second alternating voltages $U_1$, $U_2$ (not shown in FIG. 7 for clarity reasons) which are applied to first ends 225*a*, 225*b* of the first group 224*a* and the second group 224*b* of cords 223 of the suspension member 11, respectively. Of course, depending on whether or not an electric current is flowing through the circuitry, the first and second alternating voltages $U_1$, $U_2$ may be slightly lower than the generated voltages $U_{G1}$, $U_{G2}$ due to a voltage drop in the electrical resistances $R_3$, $R_4$.

The first and second voltages $U_1$, $U_2$ are then transmitted through the series connection of odd numbered cords 223 of the first group 224*a* and the series connection of even numbered cords 223 of the second group 224*b*, respectively, such that a third and a fourth alternating voltage $U_3$, $U_4$ occur at the opposite second ends 227*a*, 227*b* of both groups of cords 224*a*, 224*b*.

When there are no shunts and no electrical connection between these two second ends 227*a*, 227*b*, no electrical current will flow such that the third and fourth alternating voltages $U_3$, $U_4$ will be the same as the applied first and second alternating voltages $U_1$, $U_2$. In other words, as long as no deterioration occurs in the suspension member 11, the third and fourth alternating voltages $U_3$, $U_4$ will exactly follow the applied first and second alternating voltages $U_1$, $U_2$. Accordingly, upon determining such alternating voltage behaviours for the third and fourth alternating voltages $U_3$, $U_4$, it may be determined that the suspension member 11 is in a normal condition in which no further action is required.

In such non-deteriorated state, due to the 180° phase-shift between the third and fourth alternating voltages $U_3$, $U_4$, a summed voltage $U_+$ corresponding to the sum of the third and fourth alternating voltages $U_3$, $U_4$ is a constant voltage, i.e. a DC voltage being the sum of the base DC voltages of the generated alternating voltages $U_{G1}$, $U_{G2}$ (i.e. in the given example: $U_3+U_4=6$ V+6 V=12 V). Accordingly, in such state, the summed voltage $U_+$ has no alternating voltage component (i.e. $U_{+,AC}=0$). A differential voltage $U_-$ corresponding to a difference of the third and fourth alternating voltages $U_3$, $U_4$ alternates with a same frequency as the generated voltages $U_{G1}$, $U_{G2}$ and with double the amplitude of these generated voltages $U_{G1}$, $U_{G2}$ around a DC voltage of 0 V (i.e. in the given example, $U_-$ alternates between −12 and +12 V).

As will be described in further detail below, in cases where the suspension member 11 is deteriorated or even damaged, such initial conditions for the third and fourth voltage $U_3$, $U_4$ do no longer apply. Particularly, when at least one of the cords 223 in the suspension member 11 is broken or if there is a short-circuit 245, 247 between cords 223 or if there is an electrical connection to ground 241, 243 for at least one of the cords 223, either an electrical connection between the first ends 225a, 225b and the second ends 227a, 227b is partly interrupted (i.e. in the case of a broken cord) or electrical currents will flow (i.e. in the case of short-circuits or connections to ground). Accordingly, in such deteriorated conditions, the third and fourth voltages $U_3$, $U_4$ will no longer follow the generated voltages $U_{G1}$, $U_{G2}$ in the same manner as in the non-deteriorated state and, as a result, the summed voltage $U_+$ and/or the differential voltage $U_-$ will change their behaviour.

Accordingly, any deviation from a state in which the summed voltage $U_+$ comprises no alternating voltage component $U_{+,AC}$ and the differential voltage $U_-$ comprises an alternating voltage being non-zero may be interpreted as indicating a deterioration or even a damage in the monitored suspension member 11.

While, in principle, a simple circuitry of the device 217 in which the second ends 227a, 227b of the first and second groups 224a, 224b of cords 223 are not electrically connected might be sufficient for monitoring the suspension member 11 as it may at least detect whether or not the suspension member 11 is deteriorated or not, it may be advantageous to modify such open circuitry by connecting the second ends 227a, 227b of the two groups 224a, 224b of cords 223 via a connecting electrical resistance $R_5$. Such connecting electrical resistance $R_5$ may have a resistance in a range of several tens or hundreds of Ohms, i.e. a resistance which is significantly higher than resistances typically occurring throughout the series connections of cords 223 in the suspension member 11 (such resistances being typically in a range of some Ohms to a few tenth of Ohms, depending on the length of the suspension member). In the example given in FIG. 6, $R_5$ is assumed to be 100 Ohm.

Due to such electrical connection of the second ends 227a, 227b and the third and fourth voltages $U_3$, $U_4$ occurring at these second ends 227a, 227b, an electrical current may flow through the entire circuitry of the device 217. As a result of such electrical current, voltage drops will occur at all resistances included in such circuitry, thereby directly influencing all voltages $U_x$ (x=1, 2, 3, 4) at the various positions within the circuitry. For example, the first and second voltages $U_1$, $U_2$ will be lower than the generated voltages $U_{G1}$, $U_{G2}$ due to the internal resistances $R_3$, $R_4$. The third and fourth voltages $U_3$, $U_4$ at the second ends 227a, 227b will be lower than the first and second voltages $U_1$, $U_2$ due to electrical resistances within the series connections of cords 223 of the suspension member 11.

Using the principles of measurement indicated before, various types of damages or deterioration to suspension members may be determined. The following table briefly indicates some possibilities of detectable electrical characteristics relating to specific damages or deteriorations and of voltages occurring during respective measurements.

| | $U_+$ | | $U_-$ | | Phase angles | | |
|---|---|---|---|---|---|---|---|
| | AC | DC | AC | DC | $U_3$ | $U_4$ | Comment |
| OK | No signal | ~½ $U_{max}$ | Sinusoidal signal | 0 V | $G_1$ | $G_2$ | |
| Broken cord | Sinusoidal signal $2U_{max}$ peak to peak | $U_{max}$ | No signal | 0 V | $G_{xx}$ side still connected | | No load on $U_1$ and $U_2$ |
| STM not attached or both cord pairs broken | No signal | 0 V | No signal | 0 V | — | — | No load on $U_1$ and $U_2$ |
| Multiple connections to ground (measurement mode) | No signal | 0 V | No signal | 0 V | — | — | Load on $U_1$ and $U_2$ Elevator must move to detect all faults |
| Single connection to ground (measurement mode) | Sinusoidal signal | <=½ $U_{max}$ | Sinusoidal signal <= $U_3 + U_4$ | <=½ $U_{max}$ | $G_{xx}$ side not having ground fault | | Elevator must move to detect all faults |
| Adjacent connection of cords (symmetrical) | No signal | $U_{max}$ | No signal | 0 V | — | — | Elevator must move to detect all faults |
| Adjacent connection of cords (asymmetrical) | Sinusoidal signal | $U_{max}$ | No signal | 0 V | $G_{xx}$ side of the generator being closer to the fault | | Load on $U_1$ and $U_2$ Elevator must move to detect all faults |
| Damaged cords | | | Deviation from initial values | | | | |

As indicated above, further details of the approach for measuring electrical characteristics in suspension members 11 as briefly explained herein with respect to FIGS. 6 and 7 are explained in the applicant's prior patent applications EP 16 155 357 A1 and EP 16 155 358 A1.

Finally, it should be noted that terms such as "comprising" do not exclude other elements or steps and that terms such as "a" or "an" do not exclude a plurality. Also elements described in association with different embodiments may be combined. It should also be noted that reference signs in the claims should not be construed as limiting the scope of the claims.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. A method for determining a deterioration state in a suspension member arrangement for an elevator, the suspension member arrangement having a suspension member including a plurality of electrically conductive cords, the method comprising the steps of:
   counting a number of bending cycles applied to the suspension member;
   determining an electrical characteristic of the suspension member;
   performing at least one of
      (a) determining a critical deterioration state upon monitoring both the counted number of bending cycles applied to the suspension member and the determined electrical characteristic of the suspension member; and
      (b) determining an unexpected deterioration state based on deriving a current actual deterioration state of the suspension member based on the determined electrical characteristic and assuming a currently expected deterioration state based on the counted number of bending cycles and comparing the current actual deterioration state with the currently expected deterioration state;
   initiating a defined procedure for the elevator upon the determining at least one of the critical deterioration state and the unexpected deterioration state; and
   wherein the suspension member is subdivided into several sections and wherein a number of section bending cycles applied to each section of the suspension member is counted for each of the sections and wherein the number of bending cycles applied to the suspension member is set to correspond to a maximum of all the numbers of section bending cycles counted for each of the sections of the suspension member.

2. The method according to claim 1 wherein the critical deterioration state is determined upon occurrence of at least one of:
   the counted number of bending cycles applied to the suspension member exceeding an allowable maximum number; and
   the determined electrical characteristic of the suspension member deviating from a reference characteristic by more than an allowable maximum deviation.

3. The method according to claim 2 wherein the allowable maximum deviation is at least one of determined taking into account the counted number of bending cycles applied to the suspension member and fixedly predetermined.

4. The method according to claim 2 wherein the allowable maximum number is at least one of determined taking into account the determined electrical characteristic of the suspension member and fixedly predetermined.

5. The method according to claim 2 wherein the reference characteristic is determined based upon measuring the electrical characteristic of the suspension member in a non-deteriorated condition.

6. The method according to claim 1 wherein the determining of the electrical characteristic of the suspension member comprises at least one of:
   determining an electrical resistivity through the suspension member;
   determining an electrical conductivity through the suspension member;
   determining an inductivity through the suspension member;
   determining the electrical characteristic using magnetic measurements applied to the suspension member; and
   determining the electrical characteristic using phase measurements applied to the suspension member.

7. A method for determining a deterioration state in a suspension member arrangement for an elevator, the suspension member arrangement having a suspension member including a plurality of electrically conductive cords, the method comprising the steps of:
   counting a number of bending cycles applied to the suspension member;
   determining an electrical characteristic of the suspension member;
   performing at least one of
      (a) determining a critical deterioration state upon monitoring both the counted number of bending cycles applied to the suspension member and the determined electrical characteristic of the suspension member; and
      (b) determining an unexpected deterioration state based on deriving a current actual deterioration state of the suspension member based on the determined electrical characteristic and assuming a currently expected deterioration state based on the counted number of bending cycles and comparing the current actual deterioration state with the currently expected deterioration state;
   initiating a defined procedure for the elevator upon the determining at least one of the critical deterioration state and the unexpected deterioration state; and
   wherein the determining of the electrical characteristic of the suspension member comprises at least one of:
      electrical measurements indicating that at least one of the cords in the suspension member is broken;
      electrical measurements indicating that an electrical connection between a voltage supply for applying the electrical voltage to the at least one cord and the at least one of the cord is interrupted;
      electrical measurements indicating that the at least one cord is electrically connected to ground potential;
      electrical measurements indicating that at least two of the cords in the suspension member are shorted together; and
      electrical measurements indicating that an electrical conductivity through the at least one cord changed over time.

8. A method for determining a deterioration state in a suspension member arrangement for an elevator, the suspension member arrangement having a suspension member including a plurality of electrically conductive cords, the method comprising the steps of:

counting a number of bending cycles applied to the suspension member;
determining an electrical characteristic of the suspension member;
performing at least one of
   (a) determining a critical deterioration state upon monitoring both the counted number of bending cycles applied to the suspension member and the determined electrical characteristic of the suspension member; and
   (b) determining an unexpected deterioration state based on deriving a current actual deterioration state of the suspension member based on the determined electrical characteristic and assuming a currently expected deterioration state based on the counted number of bending cycles and comparing the current actual deterioration state with the currently expected deterioration state; and
initiating a defined procedure for the elevator upon the determining at least one of the critical deterioration state and the unexpected deterioration state; and
wherein, upon determining the electrical characteristic, an electric indicator current correlating to a net sum of all phases of a multi-phase alternating current is measured, wherein at least one of the phases of the multi-phase alternating current is applied to one of the cords of the suspension member.

9. The method according to claim 8 wherein the indicator current is measured using a measuring arrangement comprising a measuring device for contactless measuring of an electrical current in a conductor arrangement, the measuring device being one of a current transformer and a Hall effect current sensor.

10. A method for determining a deterioration state in a suspension member arrangement for an elevator, the suspension member arrangement having a suspension member including a plurality of electrically conductive cords, the method comprising the steps of:
   counting a number of bending cycles applied to the suspension member;
   determining an electrical characteristic of the suspension member;
   performing at least one of
      (a) determining a critical deterioration state upon monitoring both the counted number of bending cycles applied to the suspension member and the determined electrical characteristic of the suspension member; and
      (b) determining an unexpected deterioration state based on deriving a current actual deterioration state of the suspension member based on the determined electrical characteristic and assuming a currently expected deterioration state based on the counted number of bending cycles and comparing the current actual deterioration state with the currently expected deterioration state; and
   initiating a defined procedure for the elevator upon the determining at least one of the critical deterioration state and the unexpected deterioration state; and
   wherein the measuring of the electrical characteristic of the suspension member comprises the steps of:
      providing a multi-phase alternating current circuitry including multiple electrically conductive legs;
      applying at least one phase of a multi-phase alternating current to at least one of the cords of the suspension member by the at least one cord being electrically connected to one of the legs of the multi-phase alternating current circuitry;
      applying at least one other phase of the multi-phase alternating current to at least another cord of the suspension member and at least one separate resistor being electrically connected to at least one other leg of the multi-phase alternating current circuitry, wherein a peak current in each phase is shifted by a phase angle with respect to a peak current in another phase;
      measuring an electric indicator current being at least one of a net sum of all phases of the multi-phase alternating current, and an electric bypass current through a neutral wire being connected in parallel to the multi-phase alternating current circuitry; and
      determining the measured electrical characteristic of the suspension member based on the measured indicator electric current.

11. The method according to claim 10 wherein the indicator current is measured using a measuring arrangement comprising a measuring device for contactless measuring of an electrical current in a conductor arrangement, the measuring device being one of a current transformer and a Hall effect current sensor.

12. A method for determining a deterioration state in a suspension member arrangement for an elevator, the suspension member arrangement having a suspension member including a plurality of electrically conductive cords, the method comprising the steps of:
   counting a number of bending cycles applied to the suspension member;
   determining an electrical characteristic of the suspension member;
   performing at least one of
      (a) determining a critical deterioration state upon monitoring both the counted number of bending cycles applied to the suspension member and the determined electrical characteristic of the suspension member; and
      (b) determining an unexpected deterioration state based on deriving a current actual deterioration state of the suspension member based on the determined electrical characteristic and assuming a currently expected deterioration state based on the counted number of bending cycles and comparing the current actual deterioration state with the currently expected deterioration state; and
   initiating a defined procedure for the elevator upon the determining at least one of the critical deterioration state and the unexpected deterioration state; and
   wherein the suspension member has a first group and a second group of electrically conductive cords, and wherein the measuring of the electrical characteristic comprises the steps of:
      applying a first alternating voltage to a first end of the first group of cords;
      applying a second alternating voltage to a first end of the second group of cords, wherein the first and second alternating voltages have same waveforms and a phase difference of 180°, and wherein a second end of the first group of cords and a second end of the second group of cords are electrically connected via a connecting electrical resistance;
      determining at least one of
         (i) a summed voltage correlating to a sum of a third voltage between the second end of the first group of cords and a common electrical potential and a fourth voltage between the second end of the second group of cords and the common electrical potential;

(ii) a differential voltage correlating to a difference between the third voltage and the fourth voltage; and determining the electrical characteristic of the suspension member based on at least one of the summed voltage and the differential voltage, wherein any deviation from a state in which the summed voltage comprises no alternating voltage component and the differential voltage comprises an alternating voltage component is interpreted as indicating an electrical characteristic relating to the critical deterioration state in the suspension member.

13. A monitoring arrangement configured to perform the method according to claim 1 for determining the deterioration state in the suspension member arrangement.

14. The monitoring arrangement according to claim 13 comprising:

a counter device for counting a number of bending cycles applied to the suspension member based on information obtained from an elevator control device for controlling operation of the elevator;

an electrical measuring device electrically connected to at least one of the cords in the suspension member for measuring the electrical characteristic of the suspension member upon applying an electrical voltage to the at least one cord;

a determination device for determining at least one of (a) a critical deterioration state of the suspension member upon monitoring both:

the counted number of bending cycles applied to the suspension member, and the determined electrical characteristic of the suspension member, and (b) an unexpected deterioration state of the suspension member based on deriving a current actual deterioration state of the suspension member based on the determined electrical characteristic and assuming a currently expected deterioration state based on the counted number of bending cycles and comparing the current actual deterioration state with the currently expected deterioration state.

15. An elevator comprising the suspension member, a car connected to the suspension member and a monitoring arrangement according to claim 14.

* * * * *